(12) United States Patent
Wang et al.

(10) Patent No.: US 12,005,481 B2
(45) Date of Patent: Jun. 11, 2024

(54) SYSTEMS FOR IMPROVED EFFICIENCY OF BALL MOUNT CLEANING AND METHODS FOR USING THE SAME

(71) Applicant: Taiwan Semiconductor Manufacturing Company Limited, Hsinchu (TW)

(72) Inventors: Ying-Hao Wang, Tainan (TW); Chien-Lung Chen, Hsinchu (TW); Chia-Han Chuang, Changhua County (TW); Jhe-Hong Wang, Hsinchu (TW); Chien-Chi Tzeng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/723,982

(22) Filed: Apr. 19, 2022

(65) Prior Publication Data
US 2023/0330710 A1 Oct. 19, 2023

(51) Int. Cl.
*B08B 3/02* (2006.01)
*H01L 21/677* (2006.01)
(Continued)

(52) U.S. Cl.
CPC ........ *B08B 3/022* (2013.01); *H01L 21/67706* (2013.01); *B05B 9/035* (2013.01);
(Continued)

(58) Field of Classification Search
CPC ..... B08B 3/022; B05B 9/035; B05B 13/0221; H01L 21/67706; H01L 23/3675; H01L 25/0652; H01L 25/18
See application file for complete search history.

(56) References Cited

U.S. PATENT DOCUMENTS 3,291,143 A * 12/1966 Huddle ............... B05B 13/0221
248/500
6,250,318 B1 * 6/2001 Kiat .................. H01L 21/67028
134/131
(Continued)

FOREIGN PATENT DOCUMENTS

CN 215422488 U * 1/2022
FR 3048193 A1 * 9/2017 ............. B08B 3/022
(Continued)

*Primary Examiner* — Sharidan Carrillo
(74) *Attorney, Agent, or Firm* — The Marbury Law Group, PLLC

(57) ABSTRACT

An embodiment system, configured to clean a semiconductor package assembly, may include a sprayer device including a plurality of nozzles configured to direct a pressurized cleaning fluid toward the semiconductor package assembly; a conveyor configured to move the semiconductor package assembly relative to the sprayer device along a first direction; and a dryer spatially displaced from the sprayer device and configured to direct a pressurized gas flow toward the semiconductor package assembly to remove cleaning fluid introduced by the sprayer device. Each of the plurality of nozzles may be displaced from one another along a second direction to thereby generate respective separate spray distribution patterns. Adjacent nozzles may be further displaced from one another along a third direction to thereby a reduce an overlap of adjacent spray distribution patterns relative to a configuration in which the adjacent nozzles are not displaced from one another along the third direction.

20 Claims, 16 Drawing Sheets

(51) Int. Cl.
   *B05B 9/03*      (2006.01)
   *B05B 13/02*     (2006.01)
   *H01L 23/367*    (2006.01)
   *H01L 25/065*    (2023.01)
   *H01L 25/18*     (2023.01)

(52) U.S. Cl.
   CPC ....... *B05B 13/0221* (2013.01); *H01L 23/3675* (2013.01); *H01L 25/0652* (2013.01); *H01L 25/18* (2013.01)

(56) References Cited

U.S. PATENT DOCUMENTS

2007/0095366 A1* 5/2007 Verhaverbeke ........ C11D 7/265
                                                257/E21.255
2012/0216840 A1* 8/2012 Nishigaki ............... H01L 24/75
                                                134/198
2016/0358830 A1* 12/2016 Dangler ............. B05C 11/1036

FOREIGN PATENT DOCUMENTS

JP   2001040612 A  *  2/2001
WO   WO-2006124500 A2 * 11/2006 ........... B05B 12/122

* cited by examiner

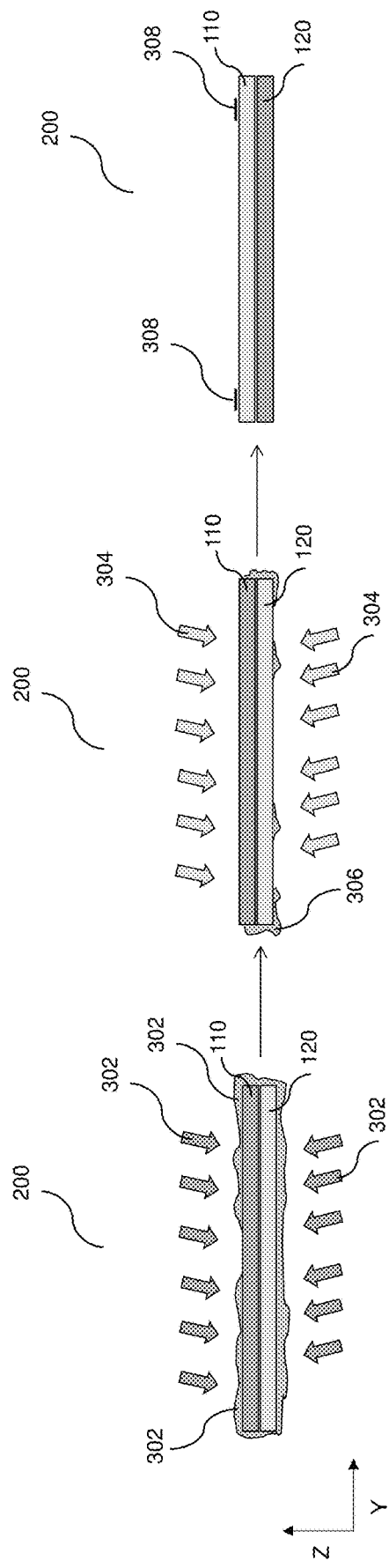

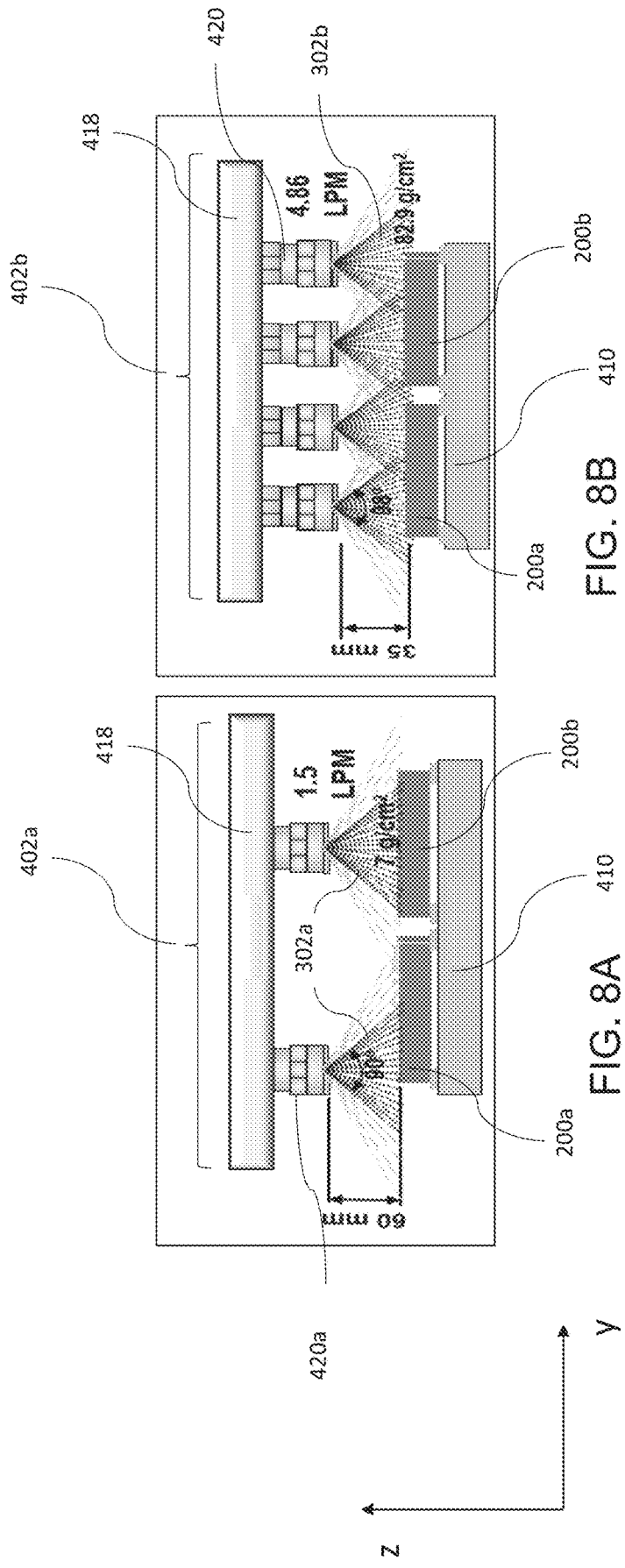

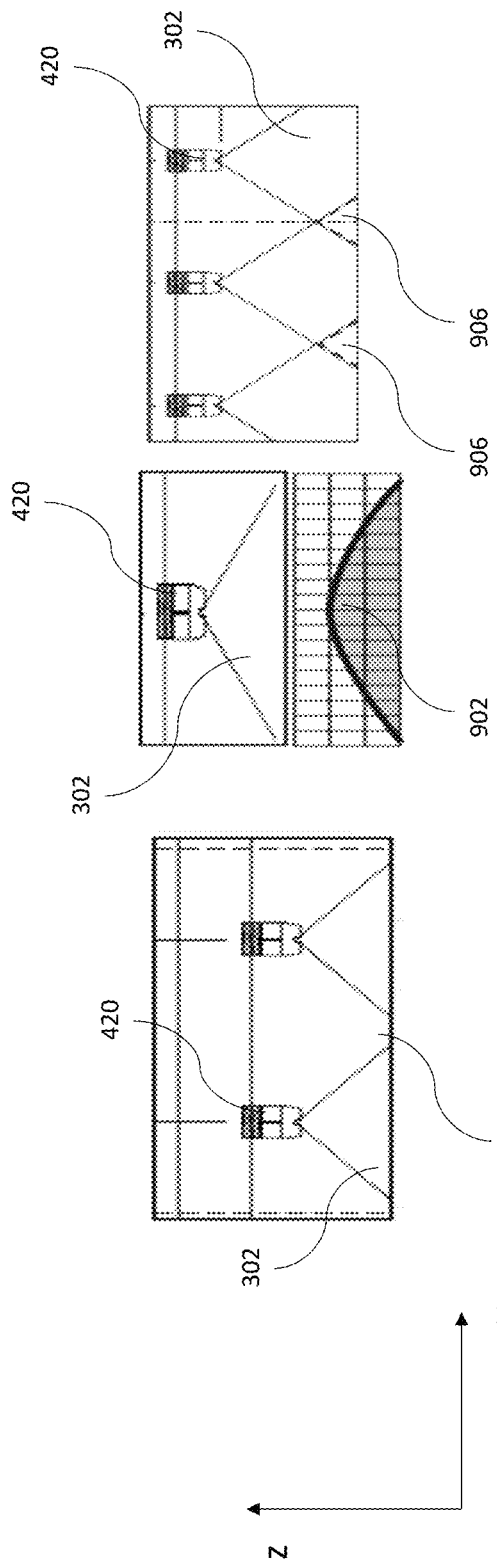

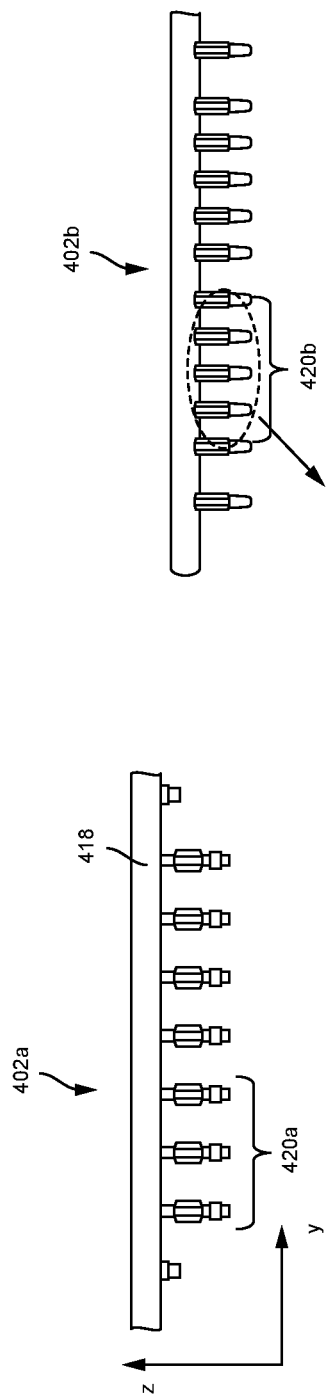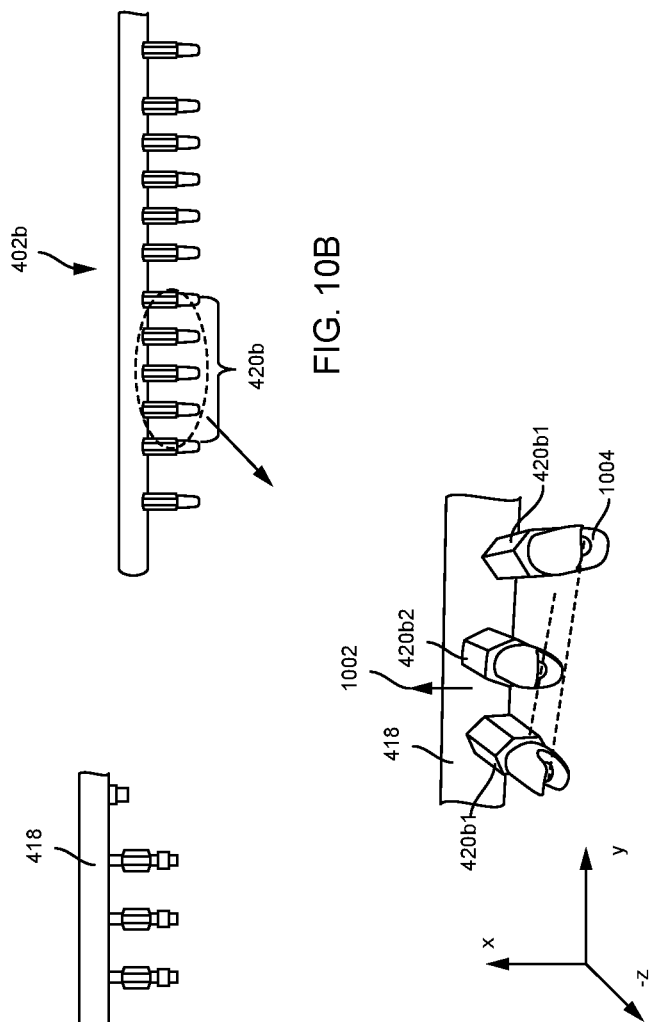

SYSTEMS FOR IMPROVED EFFICIENCY OF BALL MOUNT CLEANING AND METHODS FOR USING THE SAME

BACKGROUND

Semiconductor devices are used in a variety of electronic applications, such as personal computers, cell phones, digital cameras, and other electronic equipment Semiconductor devices are typically fabricated by sequentially depositing insulating or dielectric layers, conductive layers, and semiconductive layers over a semiconductor substrate, and patterning the various material layers using lithography and etch to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example. There is a continuing need for improvements of semiconductor packages.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a vertical cross-sectional view of a semiconductor package assembly in a first configuration during a first stage of a cleaning process.

FIG. 3B is a vertical cross-sectional view of a semiconductor package assembly in a second configuration during a second stage of a cleaning process.

FIG. 3C is a vertical cross-sectional view of a semiconductor package assembly showing evidence of an incomplete cleaning process.

FIG. 8A is a vertical cross-sectional view of a portion of the system of FIGS. 4 to 6 illustrating a first sprayer device having a first configuration, according to various embodiments.

FIG. 8B is a vertical cross-sectional view of a portion of the system of FIGS. 4 to 6 illustrating a second sprayer device having a second configuration, according to various embodiments.

FIG. 9A illustrates non-overlapping spray distribution patterns from nozzles that are sufficiently separated, according to various embodiments.

FIG. 9B illustrates an impact force distribution pattern from a single nozzle, according to various embodiments.

FIG. 9C illustrates overlapping spray distribution patterns from nozzles that are closely spaced, according to various embodiments.

FIG. 10A illustrates a first sprayer device having a first plurality of nozzles, according to various embodiments.

FIG. 10B illustrates a second sprayer device having a second plurality of nozzles, according to various embodiments.

FIG. 10C is a close-up view of a portion of the second sprayer device of FIG. 10B, according to various embodiments.

DETAILED DESCRIPTION

Figure 1A:
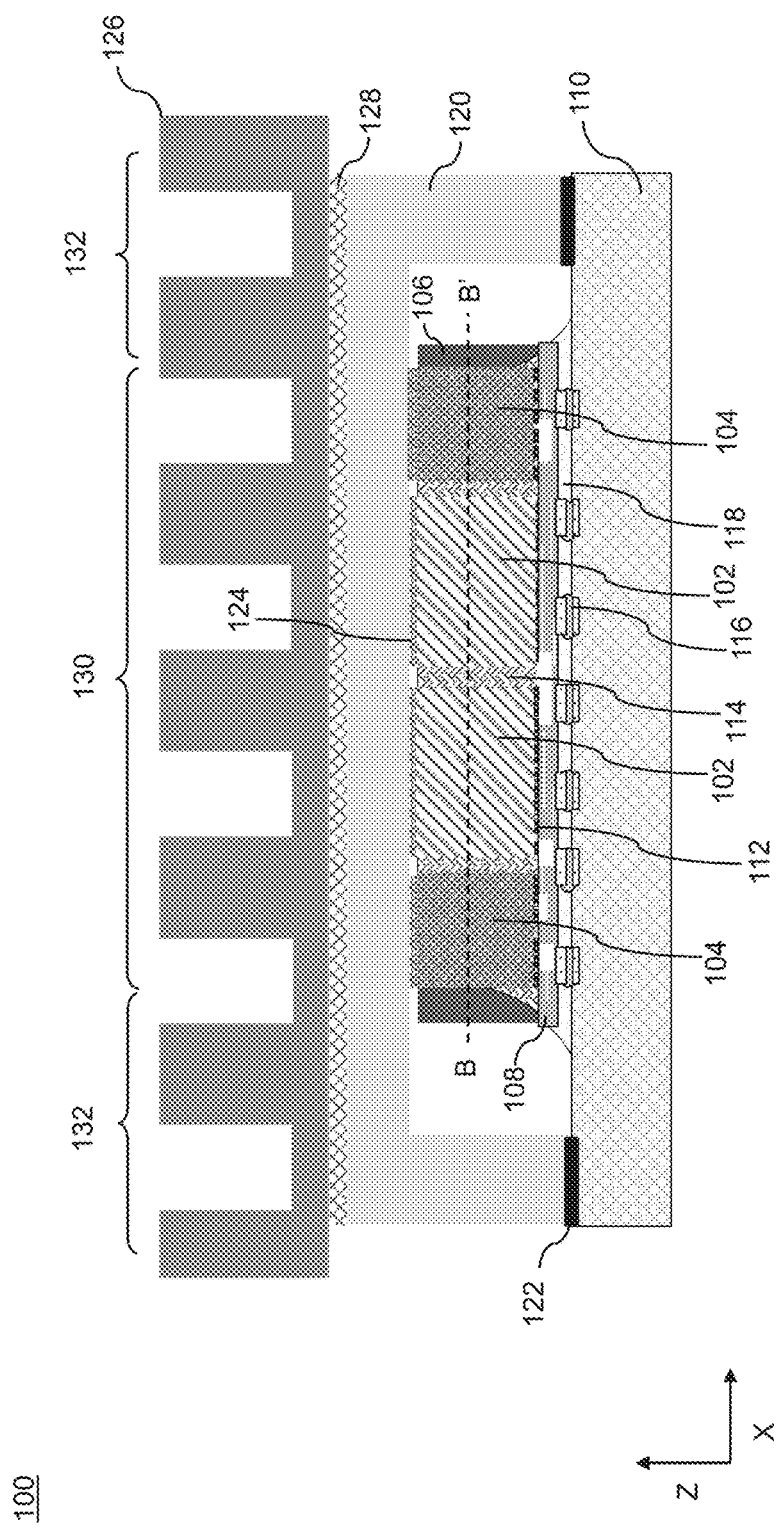
FIG. 1A is a vertical cross-sectional view of a semiconductor device along line AA' in FIG. 1B, according to various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The semiconductor package typically includes a housing that encloses the IC dies to protect the IC dies from damage. The housing may also provide sufficient heat dissipation from the semiconductor package. In some cases, the semiconductor package may include a package lid including a thermally-conductive material (e.g., a metal or metal alloy, such as copper). The package lid may be located over the IC dies. Heat from the IC dies may be transferred from the upper surfaces of the IC dies into the package lid and may be ultimately dissipated to the environment. The heat may optionally be dissipated through a heat sink that may be attached to or may be integrally formed with the lid.

A semiconductor package assembly, which may include one or more integrated circuit dies coupled to a package substrate and covered by a package lid, may undergo cleaning to remove flux residue and other contaminants that may arise during a reflow operation that may be performed to couple the one or more integrated circuit dies to the package substrate. A cleaning operation may introduce a pressurized cleaning fluid to remove flux residue and other contaminants. The cleaning process may further introduce a flow of pressurized gas to remove cleaning fluid and to dry internal and external surfaces of the package assembly. Disclosed systems may provide an improved cleaning efficiency by providing sprayer devices that achieve a more uniform distribution of pressurized cleaning fluid that may be directed to the semiconductor package assembly. Disclosed systems may further improve cleaning efficiency by providing a dryer having an jet air knife that provides a high pressure gas flow that may have increased drying efficiency and an increased efficiency of cleaning fluid removal from a semiconductor package assembly (including cleaning fluid removal from spaces within the package lid).

According to various embodiments of this disclosure, a system configured to clean a semiconductor package assembly is provided. The system may include a sprayer device including a plurality of nozzles configured to direct a pressurized cleaning fluid toward the semiconductor package assembly; a conveyor configured to move the semiconductor package assembly relative to the sprayer device along a first direction; and a dryer spatially displaced from the sprayer device along the first direction and configured to direct a pressurized gas flow at the semiconductor package assembly to remove cleaning fluid introduced by the sprayer device. Each of the plurality of nozzles may be displaced from one another along a second direction to thereby generate respective separate spray distribution patterns. Adjacent nozzles may be displaced from one another along a third direction perpendicular to the second direction to thereby a reduce an overlap of adjacent spray distribution patterns relative to a configuration in which the adjacent nozzles are not displaced from one another along the third direction.

In a further embodiment, a system may be configured to clean a semiconductor package assembly. Various embodiments systems may include a sprayer device that include a plurality of fluidic nozzles configured to direct a pressurized cleaning fluid at the semiconductor package assembly; a conveyor configured to move the semiconductor package assembly relative to the sprayer device along a first direction; and a dryer spatially displaced from the sprayer device along the first direction and configured to direct a pressurized gas flow toward the semiconductor package assembly to remove cleaning fluid introduced by the sprayer device. The dryer may be configured as a jet air knife configured to generate the pressurized gas flow having a pressure in a range from approximately 0.02 MPa to approximately 0.08 MPa at a distance from the semiconductor package assembly that is in a range from approximately 0 mm to approximately 20 mm.

An embodiment method of cleaning a semiconductor package assembly may include moving the semiconductor package assembly along a first direction relative to a sprayer device and a dryer using a conveyor, wherein the sprayer device and the dryer are spatially displaced relative to one another along the first direction such that the semiconductor package assembly moves past the sprayer device before moving past the dryer; directing a pressurized cleaning fluid toward the semiconductor package assembly, using the sprayer device, while the semiconductor package assembly moves past the sprayer device; and directing a pressured gas flow toward the semiconductor package assembly, using the dryer, while the semiconductor package assembly moves past the dryer. Directing the pressurized cleaning fluid toward the semiconductor package assembly may further includes generating a plurality of spray distribution patterns using a plurality of fluidic nozzles that are displaced from one another along a second direction. Adjacent nozzles may be further displaced from one another along a direction perpendicular to the second direction to thereby a reduce an overlap of adjacent spray distribution patterns relative to a configuration in which the adjacent nozzles are not displaced from one another along the direction perpendicular to the second direction.

Figure 1B:
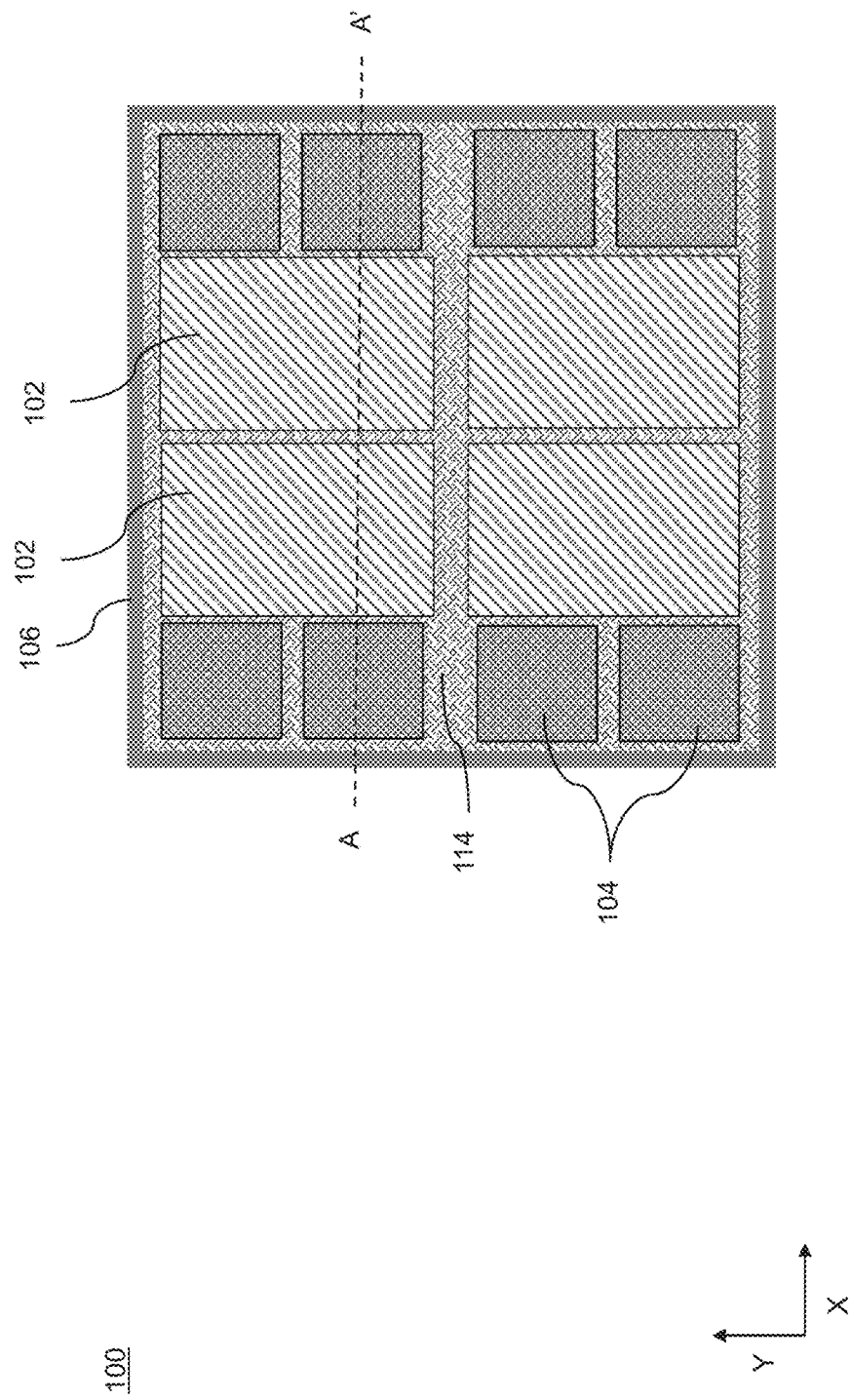
FIG. 1B is a horizontal cross-sectional view of the semiconductor device along line BB' in FIG. 1A, according to various embodiments.

FIG. 1A is a vertical cross-section view of a semiconductor device 100 according to various embodiments. FIG. 1B is a horizontal cross-section view of the semiconductor device 100 taken along line B-B' in FIG. 1A. The view of FIG. 1A is taken along the line A-A' in FIG. 1B. The semiconductor device 100 may include one or more integrated circuit (IC) semiconductor devices. For example, the semiconductor device 100 may include a first plurality of semiconductor dies 102 and a second plurality of semiconductor dies 104. In various embodiments, each semiconductor die 102 may be configured as a three-dimensional device, such as a three-dimensional integrated circuit (3DICs), a system-on-chip (SOC) device, or a system-on-integrated-circuit (SoIC) device.

Each of the semiconductor dies 102 may be formed by placing chips over other chips on a semiconductor wafer level. These three-dimensional (3D) devices may provide improved integration density, yield and other advantages, such as faster speeds and higher bandwidths, due to a decreased length of interconnects between the stacked chips. In some embodiments, one of the semiconductor dies 102 may also be referred to as a "first die stack." In some embodiments, each of the semiconductor dies 102 may be dies or chips, such as logic dies, or power management dies.

In the semiconductor device 100 illustrated in FIGS. 1A and 1B, the plurality of semiconductor dies 102 includes four first die stacks, each of which may be configured as a system-on-chip (SOC) device. In various embodiments, the semiconductor dies 102 may be adjacent to one another and may be located in a central portion of the semiconductor device 100. The semiconductor device 100 may further include one or more additional semiconductor dies 104. In some embodiments, the one or more additional semiconductor dies 104 may be three-dimensional (3D) IC semiconductor devices, and may also be referred to as "second die stacks." In some embodiments, the additional semiconductor dies 104 may each be a semiconductor memory device, such as a high bandwidth memory (HBM) device.

In the embodiment shown in FIGS. 1A and 1B, the plurality of additional semiconductor dies 104 includes eight (8) second die stacks, each of which may be an HBM device. The additional semiconductor dies 104 may be located on a periphery around the semiconductor dies 102, as shown in FIG. 1B. A molding 106, which may include an epoxy-based material, may be located around the periphery of the semiconductor dies 102 and the additional semiconductor dies 104. Although the embodiment illustrated in FIGS. 1A and 1B includes four (4) semiconductor dies 102 and eight (8) additional semiconductor dies 104, greater or fewer die stacks may be included in the package.

Referring again to FIG. 1A, the semiconductor dies 102 and the additional semiconductor dies 104 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads (not shown) on upper and lower surfaces of the interposer 108 and a plurality of conductive interconnects (not shown) extending through the interposer 108 between the upper and lower bonding pads of the interposer 108.

The conductive interconnects may distribute and route electrical signals between IC semiconductor devices (e.g., semiconductor dies 102 and additional semiconductor dies 104) and a package substrate 110. Thus, the interposer 108 may also be referred to as redistribution layers (RDLs). A plurality of metal bumps 112, such as micro-bumps, may electrically connect conductive bonding pads on the bottom surfaces of the semiconductor dies 102 and additional semiconductor dies 104 to the conductive bonding pads on the upper surface of the interposer 108. In one non-limiting embodiment, metal bumps 112 in the form of micro-bumps may include a plurality of first metal stacks, such as a plurality of Cu—Ni—Cu stacks, located on the bottom surfaces of the semiconductor dies 102 and the additional semiconductor dies 104. A corresponding plurality of second metal stacks (e.g., Cu—Ni—Cu stacks) may be located on the upper surface of the interposer 108. A solder material, such as tin (Sn), may be located between respective first and second metal stacks to electrically connect the semiconductor dies 102 and the additional semiconductor dies 104 to the interposer 108. Other suitable materials for the metal bumps 112 are within the contemplated scope of this disclosure.

A first underfill material portion 114 may be provided in the spaces surrounding the metal bumps 112 and between the bottom surfaces of the semiconductor dies 102, the additional semiconductor dies 104, and the upper surface of the interposer 108. The first underfill material portion 114 may also be provided in the spaces laterally separating adjacent die stacks (i.e., semiconductor dies 102 and additional semiconductor dies 104) of the semiconductor device 100. Thus, the first underfill material portion 114 may extend over side surfaces of the semiconductor dies 102 and/or the additional semiconductor dies 104, as shown in FIG. 1A. In various embodiments, the first underfill material portion 114 may include an epoxy-based material, which may include a composite of resin and filler materials. Other underfill materials are within the contemplated scope of this disclosure.

The interposer 108 may be located on a package substrate 110, which may provide mechanical support for the interposer 108 and the IC semiconductor devices (e.g., semiconductor dies 102 and additional semiconductor dies 104) that are mounted thereon. The package substrate 110 may include a suitable material, such as a semiconductor material (e.g., a semiconductor wafer, such as a silicon wafer), a ceramic material, an organic material (e.g., a polymer and/or thermoplastic material), a glass material, combinations thereof, etc. Other suitable substrate materials are within the contemplated scope of this disclosure. In various embodiments, the package substrate 110 may include a plurality of conductive bonding pads in an upper surface of the package substrate 110. A plurality of metal bumps 116, such as C4 solder bumps, may electrically connect conductive bonding pads on the bottom surface of the interposer 108 to the conductive bonding pads on the upper surface of the package substrate 110. In various embodiments, the metal bumps 116 may include a suitable solder material, such as tin (Sn).

A second underfill material portion 118 may be provided in the spaces surrounding the metal bumps 116 and between the bottom surface of the interposer 108 and the upper surface of the package substrate 110. In various embodiments, the second underfill material portion 118 may include an epoxy-based material, which may include a composite of resin and filler materials. The second underfill material portion 118 may be the same material or a different material as the first underfill material portion 114.

A package lid 120 may be disposed over the upper surfaces of the IC semiconductor devices (e.g., the semiconductor dies 102 and the additional semiconductor dies 104). The package lid 120 may also laterally surround the IC semiconductor devices (e.g., the semiconductor dies 102 and the additional semiconductor dies 104) such that the semiconductor dies 102 and the additional semiconductor dies 104 are fully-enclosed by the combination of the package substrate 110 and the package lid 120. In other embodiments, the package lid 120 may include vent hole to allow equilibration of gases internal and external to the package lid 120, as described in greater detail with reference to FIG. 2B, below.

The package lid 120 may be attached to an upper surface of the package substrate 110 via an adhesive 122. In various embodiments, the adhesive 122 may be a thermally-conductive adhesive, such as an SW4450 adhesive from Dow Chemical Company. Other suitable adhesive materials are within the contemplated scope of this disclosure. In some embodiments, the package lid 120 may be integrally formed or may include pieces. For example, the package lid 120 may include a ring portion (not shown) surrounding the semiconductor dies 102 and the additional semiconductor dies 104, a cover portion covering the ring portion, the semiconductor dies 102, and the additional semiconductor dies 104, and an adhesive (not shown) connecting the cover portion to the ring portion.

In some embodiments, a thermal interface material layer 124 may be disposed between an upper surface of each of the IC semiconductor devices (e.g., the semiconductor dies 102 and the additional semiconductor dies 104) and an underside of the package lid 120. In various embodiments, the thermal interface material layer 124 may include a gel-type thermal interface material having a relatively high thermal conductivity. Other suitable materials for the thermal interface material layer 124 are within the contemplated scope of this disclosure. In some embodiments, the thermal interface material layer 124 may include a single thermal interface material piece covering both the semiconductor dies 102 and the additional semiconductor dies 104, or two or more thermal interface material pieces corresponding to each of the semiconductor dies 102 and the additional semiconductor dies 104.

In some embodiments, a heat sink 126 may be provided on an upper surface of the package lid 120. The heat sink 126 may include fins or other features that may be configured to increase a surface area between the heat sink 126 and a cooling fluid, such as ambient air. In some embodiments, the heat sink 126 may be a separate component that may be attached to an upper surface of the package lid 120. Alternatively, the heat sink 126 may be integrally formed with the package lid 120. In embodiments in which the heat sink 126 is a separate component from the package lid 120, a second thermal interface material layer 128 may be located between the upper surface of the package lid 120 and a bottom surface of the heat sink 126. In various embodiments, the second thermal interface material layer 128 may include a gel-type thermal interface material having a relatively high thermal conductivity. Other suitable materials for the second thermal interface material layer 128 are within the contemplated scope of this disclosure. The heat sink 126 may include a suitable thermally-conductive material, such as a metal or metal alloy.

In various embodiments, a central region 130 of the semiconductor device 100 may be a region of the semiconductor device 100 that includes a relatively higher density of the one or more integrated circuit (IC) semiconductor devices, such as the semiconductor dies 102 and the additional semiconductor dies 104 shown in FIGS. 1A and 1B. The semiconductor device 100 may include peripheral regions 132. Each of the peripheral regions 132 may be a region of the semiconductor device 100 that has a relatively lower density of integrated circuit (IC) semiconductor devices, including a region that does not include any IC semiconductor devices.

In the embodiment of FIGS. 1A and 1B, excessive heat accumulation in the semiconductor device 100 may be more likely to occur in the central region 130 of the semiconductor device 100 that includes the highest density of IC semiconductor devices (e.g., the semiconductor dies 102 and the additional semiconductor dies 104) than in the peripheral regions 132 of the semiconductor device 100. This may be because the majority of the heat in the semiconductor device 100 is generated by the IC semiconductor devices (e.g., the semiconductor dies 102 and the additional semiconductor dies 104) in the central region 130 of the semiconductor device 100. As such, heat transfer through the package lid 120 may occur primarily along the vertical direction (i.e., the direction of the z-axis in FIG. 1A) rather than spreading horizontally through the semiconductor device 100 (i.e., along the x-axis and y-axis directions in FIGS. 1A and 1B). Thus, the portion of the package lid 120 overlying the IC semiconductor devices (e.g., 102, 104) in the central region 130 of the semiconductor device 100 may be the hottest portion of the package lid 120.

The concentration of heat generating elements and the hottest portion of the package lid 120 being located in the central region may result in overheating and damage to the semiconductor device 100 if the rate of heat loss from the central region 130 of the semiconductor device 100 is not sufficiently high. In practice, this means that the package lid 120 may include a material having a very high thermal conductivity, such as copper, which has a thermal conductivity of about 398 W/m·K. However, such high-thermal conductivity materials are typically relatively expensive, which may increase the costs of the semiconductor device 100.

Figure 2A:
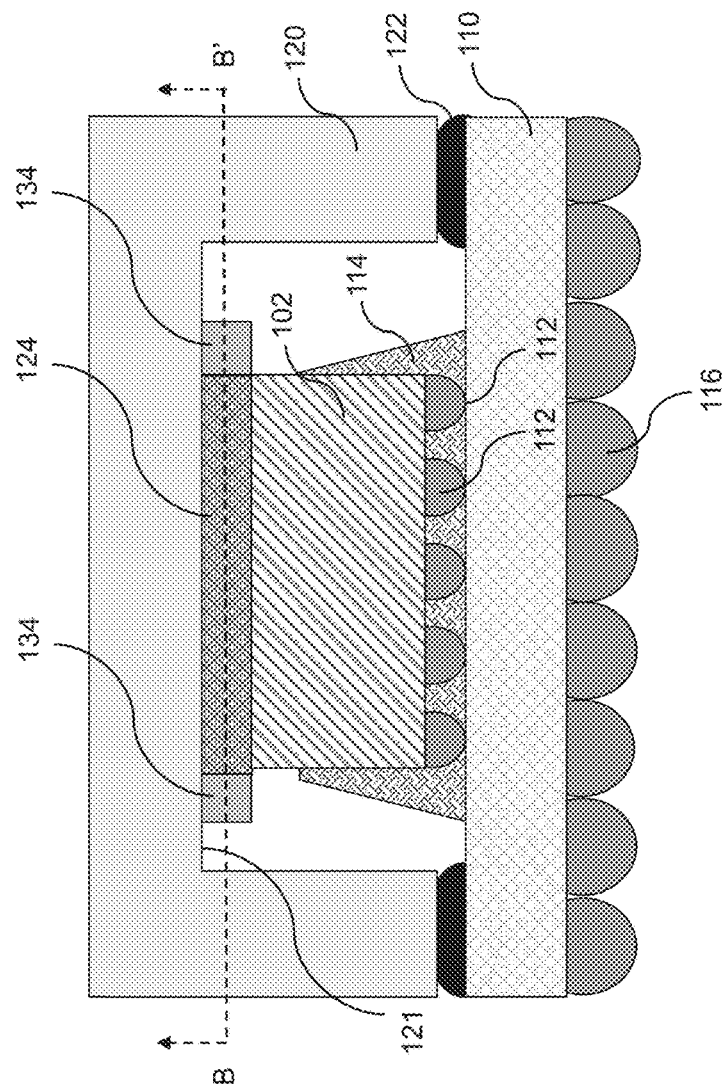
FIG. 2A is a vertical cross-section view of a semiconductor device along line AA' in FIG. 2B, according to various embodiments.

FIG. 2A is a vertical cross-section view of a semiconductor device, according to various embodiments. The semiconductor device may be configured as a semiconductor package assembly 200. The semiconductor package assembly 200 may include a package substrate 110, a semiconductor die 102 coupled to the package substrate 110, a package lid 120 attached to the package substrate 110 (e.g. with an adhesive 122) and covering the semiconductor die 102, and a thermal interface material layer 124 located between a top surface of the semiconductor die 102 and an internal surface of the package lid 120.

The semiconductor package assembly 200 may further include a plurality of metal bumps 112, such as microbumps, which may electrically connect conductive bonding pads (not shown) on a bottom surface of the semiconductor die 102 to conductive bonding pads (not shown) on an upper surface of the package substrate 110. An underfill material portion 114 may be provided in the spaces surrounding the metal bumps 112 and between the bottom surface of the semiconductor die 102 and the top surface of the package substrate 110. A plurality of metal bumps 116, such as C4 solder bumps, may electrically connect conductive bonding pads on a bottom surface of the package substrate 110. In various embodiments, the metal bumps 116 may include a suitable solder material, such as tin (Sn) and may be configured to be electrically connected to conductive bonding pads on another device component such as a printed circuit board.

The semiconductor package assembly 200 may further include a dam 134 formed on the internal surface 121 of the package lid 120. The dam 134 may be configured to constrain the thermal interface material layer 124 on one or more sides of the semiconductor die 102 such that the thermal interface material layer 124 may be located within a predetermined volume between the top surface of the semiconductor die 102 and the internal surface 121 of the package lid 120. The presence of such a dam 134 may be advantageous for certain types of thermal interface material layer 124. For example, if the thermal interface material layer 124 is a liquid or gel, the dam 134 may prevent the thermal interface material layer 124 from flowing away from the top surface of the semiconductor die.

The dam 134 may also be advantageous for use with certain metallic thermal interface materials. For example, a solder material may be used as a thermal interface material layer 124. In this regard, forming the thermal interface material layer 124 may include forming a layer of solder material in the predetermined volume between the top of the semiconductor die 102 and the internal surface 121 of the package lid 120. A reflow operation may then be performed to melt the solder material so that the solder material forms a uniform layer. During the reflow operation, the dam 134 may prevent the molten solder material from flowing away from the top surface of the semiconductor die 102. Depending on the geometry of the semiconductor package assembly 200, the dam 134 may be formed on two sides of the semiconductor die 102, as shown in FIG. 2A, or the dam 134 may be formed on greater or fewer sides of the semiconductor die 102, as described in greater detail below.

Figure 2B:
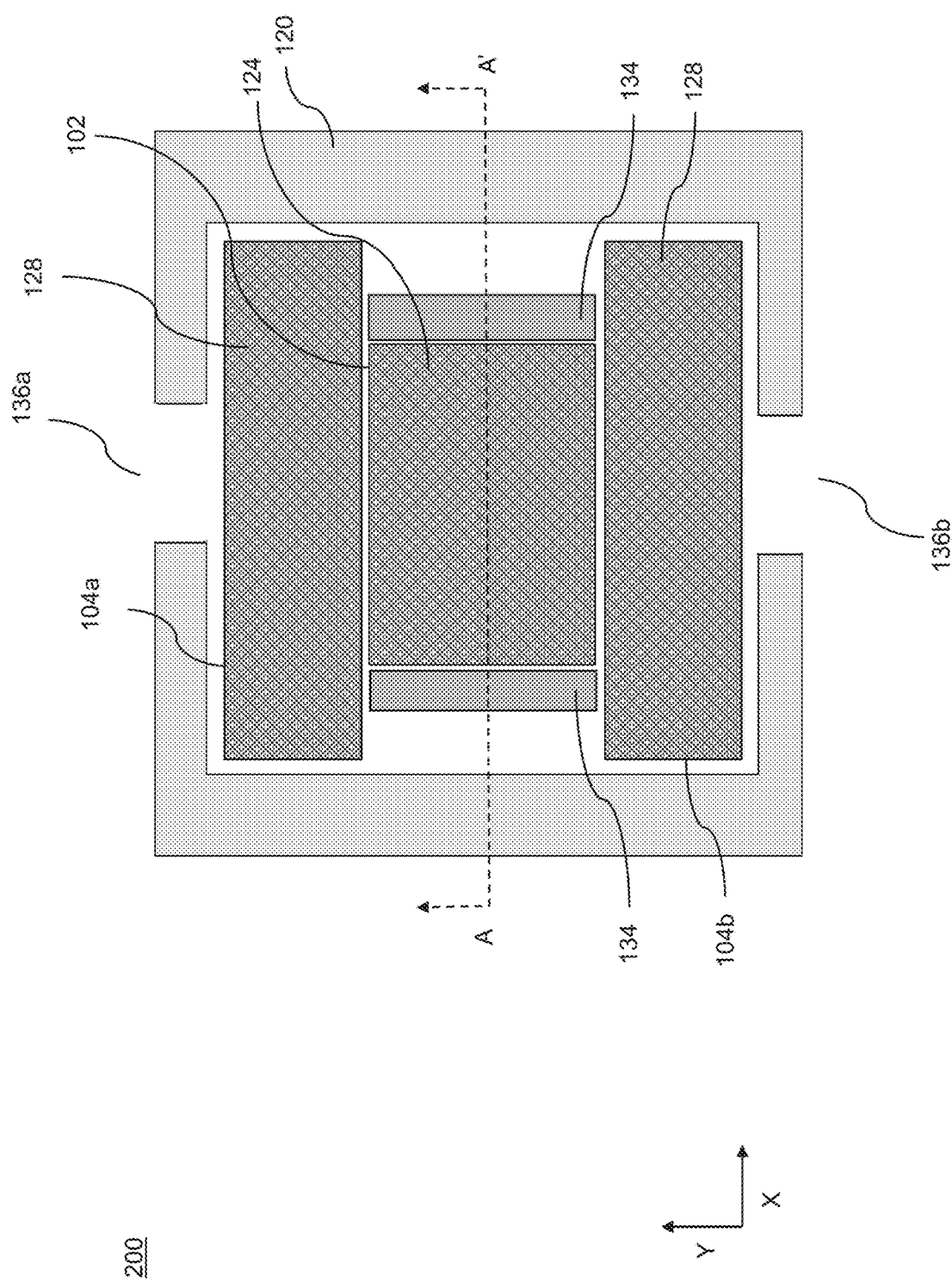
FIG. 2B is a horizontal cross-sectional view of the semiconductor device along line BB' in FIG. 2A, according to various embodiments.

FIG. 2B is a horizontal cross-sectional view of the semiconductor package assembly 200 of FIG. 2A, according to various embodiments. The line B-B' in FIG. 2A illustrates the cross section illustrated in FIG. 2B. In this regard, the cross section B-B' in FIG. 2A cuts through the package lid 120, through the dam 134, and through the thermal interface material layer 124 that may be located between the top surface of the semiconductor die 102 and the internal surface 121 of the package lid 120. The line A-A' in FIG. 2B indicates the vertical cross-sectional view of FIG. 2A. While FIG. 2A only shows a single semiconductor die (e.g., semiconductor die 102), the semiconductor package assembly 200 may further include a second semiconductor die 104a and a third semiconductor die 104b or even more dies. Each of the second semiconductor die 104a and the third semiconductor die 104b may also include a thermal interface material layer 128, as shown in FIG. 2B.

The thermal interface material layer 128 over the second semiconductor die 104a and the third semiconductor die 104b may be the same as the thermal interface material 124 over the semiconductor die 102. Alternatively, the thermal interface material layer 128 over the second semiconductor die 104a and the third semiconductor die 104b may be different from the thermal interface material layer 124 over the semiconductor die 102. For example, as described above with reference to FIGS. 1A and 1B, the heat dissipation requirements of the central region 130 may be different from the heat dissipation requirements of peripheral regions 132 (e.g., see FIG. 1A). As such, the thermal interface material layer 124 placed over the semiconductor die 102 may be chosen to have different properties from the thermal interface material layer 128 placed over the second semiconductor die 104a and the third semiconductor die 104b. For example, the thermal interface material layer 124 placed over the semiconductor die 102 may have a higher thermal conductivity and/or higher heat capacity than the thermal interface material layer 128 placed over the second semiconductor die 104a and the third semiconductor die 104b.

As shown in FIG. 2B, the second semiconductor die 104a and the third semiconductor die 104b may be respectively located adjacent to a first vent hole 136a and a second vent hole 136b of the package lid. As such, it may be advantageous to use a thermal interface material 128 that may not require the presence of a dam to constrain the thermal interface material 128 so that thermal interface material 128 may not leak out of the first vent hole 136a and the second vent hole 136b.

In the embodiment of FIGS. 2A and 2B, it may be advantageous to configure the dam 134 to be located next to two edges of the semiconductor die 102. For example, the thermal interface material layer 124 placed over the semiconductor die 102 may be a liquid or may be a solder material that may flow when a reflow operation is performed. As shown in FIG. 2A, the dam 134 may have portions respectively placed on the right and left edges of the semiconductor die 102. Similarly, in FIG. 2B, the two portions of the dam 134 may be located on two edges of the semiconductor die 102 illustrated in the top and bottom of FIG. 2B. This configuration of the dam 134 may prevent the thermal interface material layer 124 from flowing away from the semiconductor die 102 along the respective edges. In the configuration of FIG. 2B, the presence of the additional semiconductor dies 104 may prevent the thermal interface material layer 124 from flowing away from the remaining edges of the semiconductor die 102. Thus, geometry of the dam 134 may vary according to the placement of the various semiconductor dies.

In further embodiments, the dam 134 may be located on one or more sides, such as one side, two sides, three sides, or on all four sides of a semiconductor die 102 (not shown). Further, the dam 134 may be configured as a single con-
tinuous structure (not shown) or the dam 134 may have several separate pieces (not shown). In further embodiments, the dam 134 may be omitted in embodiments using suitable thermal interface materials that do not need to be constrained.

FIGS. 3A to 3C provide vertical cross-sectional views of a semiconductor package assembly 200 in various stages of a cleaning process. In this regard, the semiconductor package assembly 200 may be cleaned to remove various contaminants that may accumulate during the process of assembling the semiconductor package assembly 200. In this regard, the semiconductor die 102 may be coupled to the package substrate 110 (e.g., see FIG. 2A) by performing a reflow process to thereby bond the metal bumps 112 to bonding pads (not shown) on a bottom surface of the semiconductor die 102 to conductive bonding pads (not shown) on an upper surface of the package substrate 110. A solder material, such as tin (Sn) and may be used to bond the metal bumps to the corresponding bonding pads on the package substrate 110. A flux material may be used in the reflow process to remove metal oxides from the metal bumps 112 and bonding pads. As such, the semiconductor package assembly 200 may undergo a cleaning process to remove excess flux material. In this regard, flux residue and other contaminants may accumulate on internal and external surfaces of the package lid 120.

As shown in FIG. 3A, a first stage of a cleaning process may include directing a pressurized cleaning fluid 302 toward the semiconductor package assembly 200. In an example embodiment, deionized (DI) water may be used as the pressurized cleaning fluid 302. Other suitable cleaning fluids are contemplated within the scope of the disclosure in other embodiments. The pressurized cleaning fluid 302 may be generated by one or more sprayer devices (not shown), as described in greater detail below. The one or more sprayer devices may be configured to introduce the pressurized cleaning fluid 302 from above the semiconductor package assembly 200, from below the semiconductor package assembly 200, or from both above and below the semiconductor package assembly 200, as shown. The pressurized cleaning fluid 302 may act to remove flux residue and other contaminants from the semiconductor package assembly 200.

In a second stage of the cleaning process, a pressurized gas 304 flow may be directed at the semiconductor package assembly 200 to thereby remove remaining cleaning fluid 302, to dry surfaces of the package substrate 110, and to dry internal and external surfaces of the package lid 120. As described above, the package lid 120 may include a first vent hole 136a and a second vent hole 136b (e.g., see FIG. 2B) that may be configured to allow outgassing and pressure equalization between inside and outside surfaces of the package lid 120. The presence of the first vent hole 136a and a second vent hole 136b, however, may allow a certain amount of cleaning fluid 302 to be trapped inside the package lid 120. The pressurized gas 304 flow may then be used to remove trapped deposits of cleaning fluid and to dry internal and external surfaces of the semiconductor package assembly 200.

A certain pressure of the pressurized cleaning fluid 302 and the pressurized gas 304 may be applied to remove some or all contaminants. Further, the cleaning process may be performed for a certain time to remove some or all contaminants. In situations in which the cleaning process is insufficient, however, certain defects may remain in or on surfaces of the semiconductor package assembly 200. As shown in FIG. 3C, for example, water marks 308 may remain after an insufficient cleaning process. Other defects may include portions of remaining cleaning fluid 302 that may remain on surfaces of the semiconductor package assembly 200 (e.g., see FIG. 3B) or may be trapped within the package lid 120. Various embodiment systems and methods are provided that may allow of increased cleaning efficiency of a semiconductor package assembly 200, as described in greater detail, below.

Figure 4:
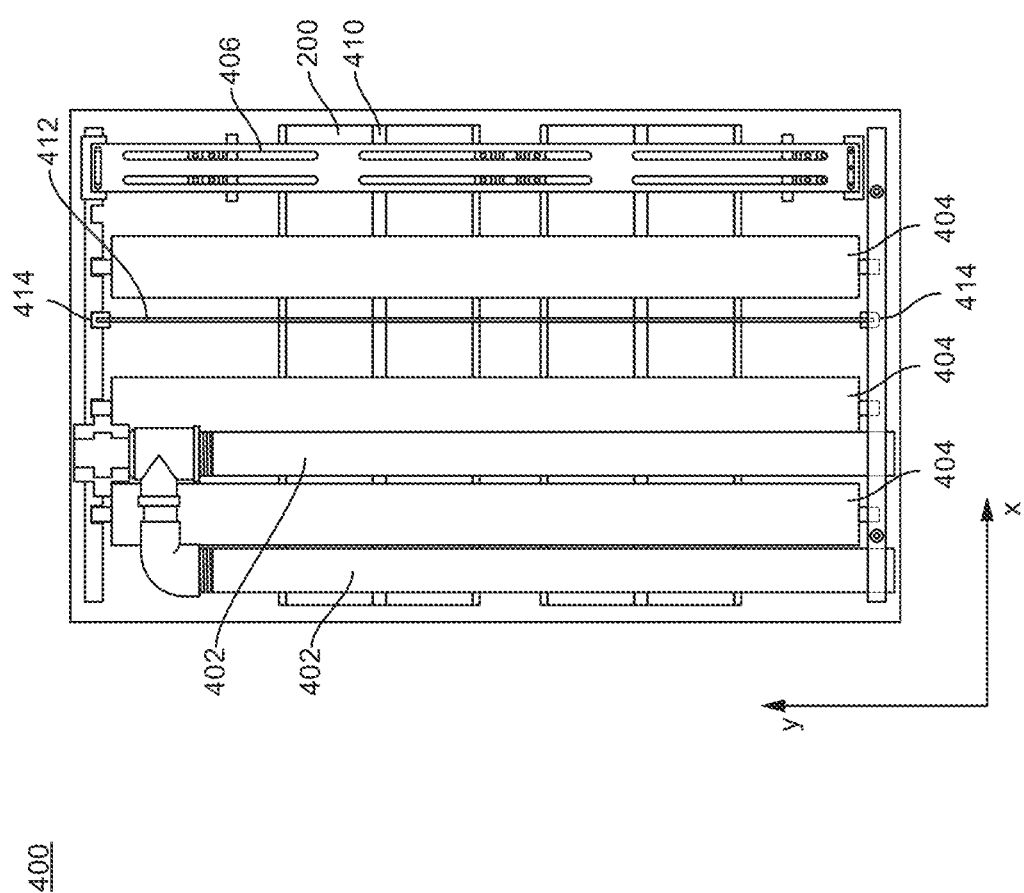
FIG. 4 is a top-down view of a system configured to clean a semiconductor package assembly, according to various embodiments.

FIG. 4 is a top down view of a system 400 configured to clean a semiconductor package assembly 200, according to various embodiments. One or more semiconductor package assemblies 200 may be provided on a conveyor (e.g., see FIGS. 7A and 7B and related description) that may be configured to move the one or more semiconductor package assemblies 200 through the system 400 along a first direction (e.g., the x-direction in FIG. 4). The conveyor may include a conveyor belt (e.g., see FIGS. 7A and 7B) and a plurality of rollers 404 that are configured to move the conveyor belt. The semiconductor package assemblies 200 may be mounted in one or more holders 410 (e.g., one or more "boats") that may be configured to securely hold the semiconductor package assemblies 200 while the semiconductor package assemblies 200 are moved through the system 400.

The system 400 may include a sprayer device 402 and a dryer 406. As shown, the dryer 406 may be spatially displaced from the sprayer device 402 along the first direction such that the semiconductor package assembly 200 may be moved by the conveyor past the sprayer device 402 before moving past the dryer 406. As described in greater detail, below, the sprayer device 402 may include a plurality of nozzles (e.g., see FIGS. 6 and 8A to 10C) configured to direct a pressurized cleaning fluid 302 toward the semiconductor package assembly 200. The dryer 406 may be configured to direct a pressurized gas flow 304 at the semiconductor package assembly 200 to remove cleaning fluid 302 introduced by the sprayer device 402, as described in greater detail, below. The system 400 may further include a baffle 412 that is secured by a baffle holder 414. The baffle 412 may act as a partition to separate a wet portion (housing the sprayer device 402) of the system 400 from a dry portion (housing the dryer 406).

Figure 5:
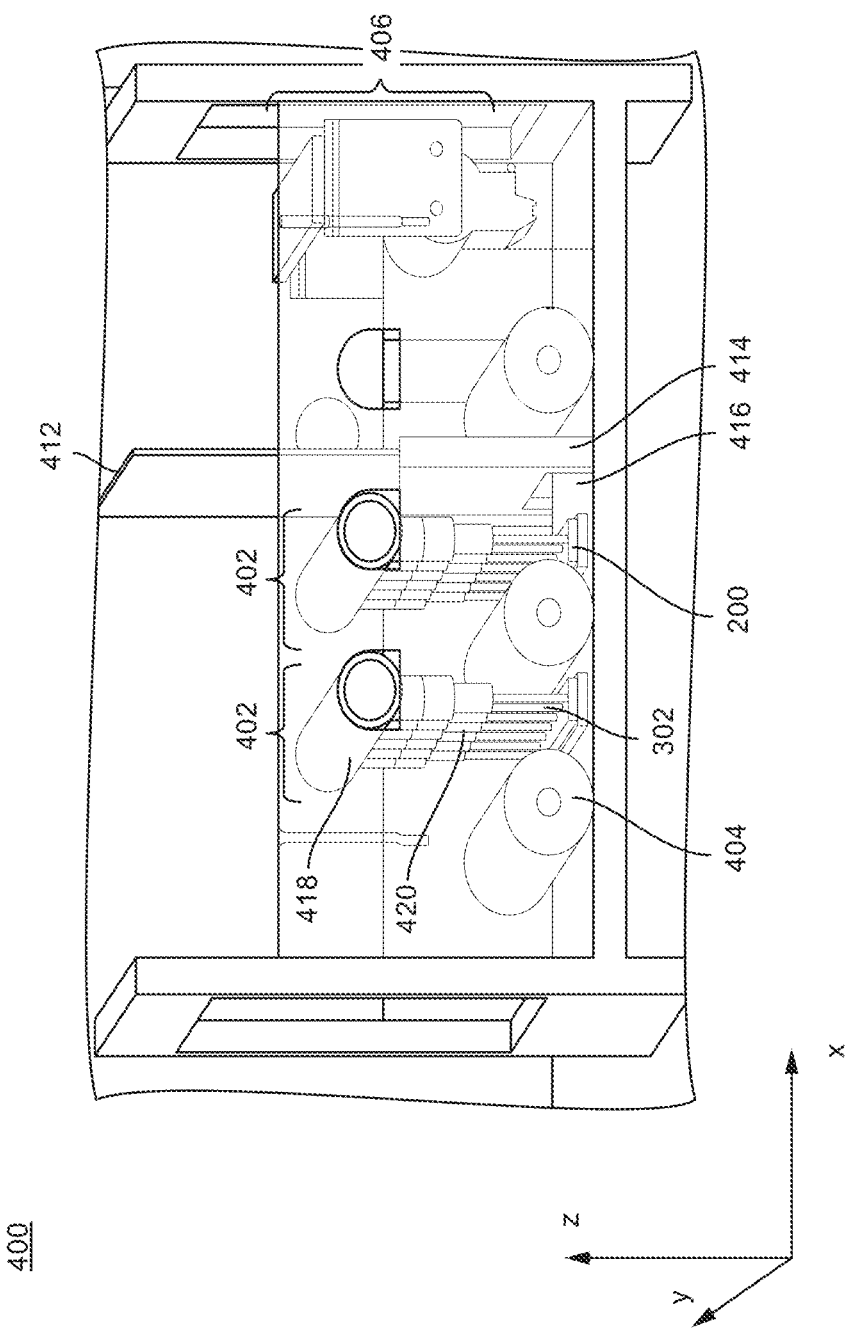
FIG. 5 is a three-dimensional perspective view of the system of FIG. 4, according to various embodiments.

FIG. 5 is a three-dimensional perspective view of the system 400 of FIG. 4, according to various embodiments. As shown, the system 400 may include the sprayer device 402, the dryer 406 and the plurality of rollers 404. As described above, the baffle 412 may separate a wet portion (housing the sprayer device 402) of the system 400 from a dry portion (housing the dryer 406). The baffle 412 may include a baffle opening 416 at a bottom portion of the baffle 412. The baffle opening 416 may be configured to allow a conveyor belt (e.g., see FIGS. 7A and 7B) to pass therethrough. As such, one or more semiconductor package assemblies 200 may be moved by the rollers 404 on the conveyor belt from the wet portion through the baffle opening 416 to the dry portion.

The sprayer device 402 may include one or more a fluidic conduit 418 extending along a second direction (i.e., the y-direction in FIG. 5). A plurality of nozzles 420 may be attached, and fluidically coupled, to the fluidic conduit 418. As described in greater detail below (e.g., see FIGS. 8A, 8B and 10A to 10C), the plurality of nozzles 420 may be displaced from one another along the second direction to thereby generate respective separate spray distribution patterns. The separate spray distribution patterns may partially or completely overlap to form a distribution of pressurized cleaning fluid 302 that extends along the second direction (i.e., the y-direction).

Figure 6:
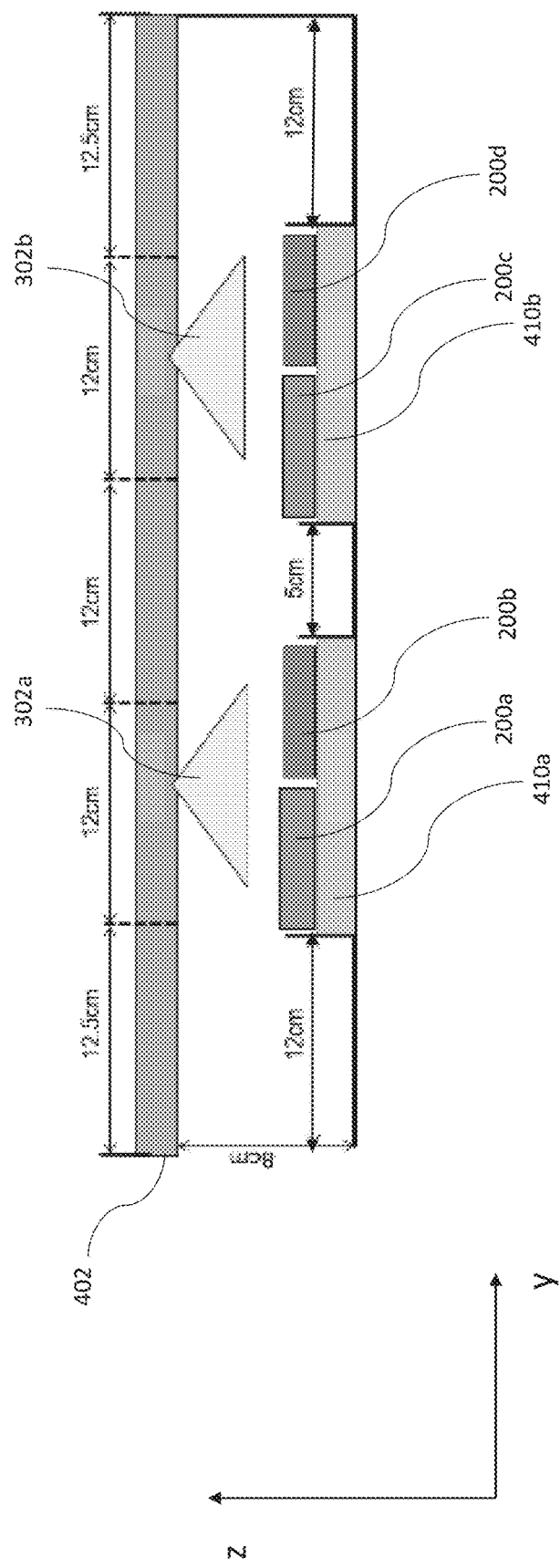
FIG. 6 is a vertical cross-sectional view of a portion of the system 400 of FIGS. 4 and 5, according to various embodiments.

FIG. 6 is a vertical cross-sectional view of a portion of the system 400 of FIGS. 4 and 5, according to various embodiments. The view of FIG. 6 is taken along the first direction (i.e., the x-direction in FIGS. 4 and 5) and illustrates relative dimensions of an example embodiment. In this example embodiment, the sprayer device 402 generates a first spatial distribution of pressurized cleaning fluid 302a and a second spatial distribution of pressurized cleaning fluid 302b. The first spatial distribution of pressurized cleaning fluid 302a and the second spatial distribution of pressurized cleaning fluid 302b may be generated by respective individual nozzles (not shown) or may each be generated by a respective plurality of nozzles (not shown), as described in greater detail, below.

As shown, a first holder 410a may be configured to hold a first semiconductor package assembly 200a and a second semiconductor package assembly 200b. Similarly, a second holder 410b may be configured to hold a third semiconductor package assembly 200c and a fourth semiconductor package assembly 200d. The conveyor may be configured to move the first holder 410a and the second holder 410b in a direction perpendicular to the plane of FIG. 6 (i.e., toward the observer) such that the first spatial distribution of pressurized cleaning fluid 302a is directed toward the first semiconductor package assembly 200a and the second semiconductor package assembly 200b, and the second spatial distribution of pressurized cleaning fluid 302b is directed toward the third semiconductor package assembly 200c and the fourth semiconductor package assembly 200d. Also as shown, the first holder 410a and the second holder 410b may be separated from one another by a certain distance (e.g., 5 cm in this embodiment). Similarly, the first spatial distribution of pressurized cleaning fluid 302a and the second spatial distribution of pressurized cleaning fluid 302b may be spatially separated so as to be non-overlapping.

Figure 7A:
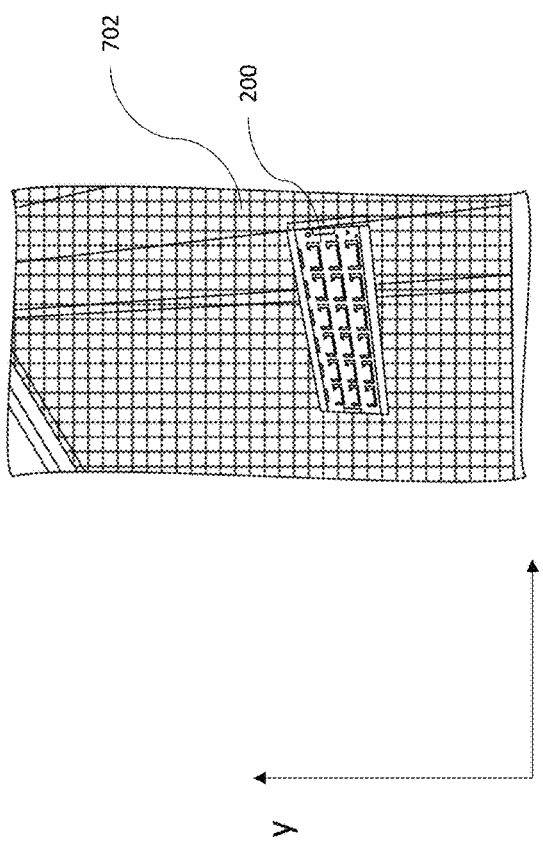
FIG. 7A is a top perspective view of a conveyor belt, according to various embodiments.
Figure 7B:
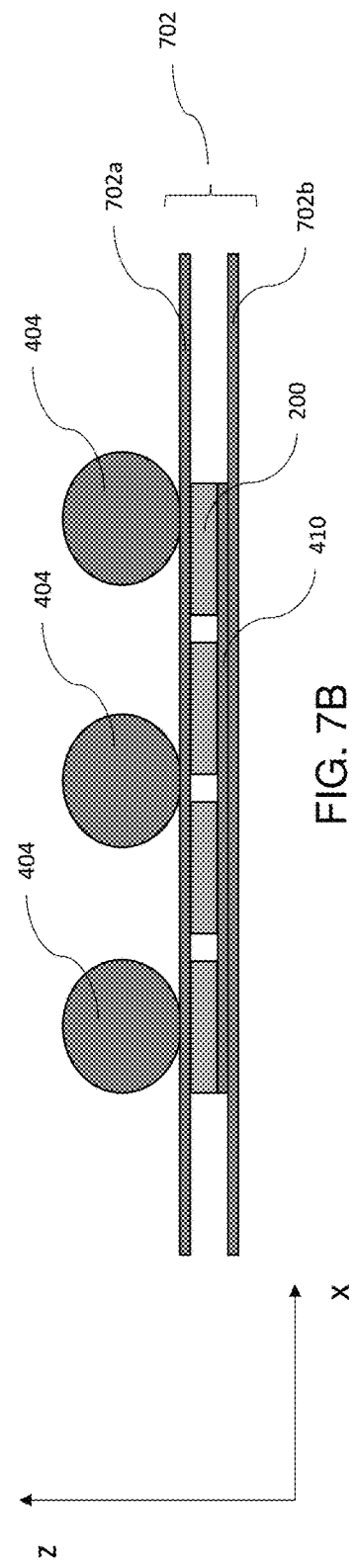
FIG. 7B is a vertical cross-sectional view of the conveyer belt of FIG. 7A, according to various embodiments.

FIG. 7A is a top perspective view of a conveyor belt 702, and FIG. 7B is a vertical cross-sectional view of the conveyor belt 702 of FIG. 7A, according to various embodiments. As shown in FIG. 7A, the conveyor belt 702 may be made of a mesh material, which may be configured to support one or more semiconductor package assemblies 200. For example, the conveyor belt 702 may be formed of a nylon mesh material. Other conveyor belt materials are within the contemplated scope of disclosure. As such, the conveyor belt 702 may be flexible and may allow pressurized cleaning fluid 302 and pressurized gas 304 to be directed toward the one or more semiconductor package assemblies 200 from above, from below, or from both above and below the semiconductor package assemblies 200, as described above with reference to FIGS. 3A and 3B.

As shown in FIG. 7B, the conveyor belt 702 may include a first portion 702a and a second portion 702b such that the one or more semiconductor package assemblies 200 may be sandwiched between the first portion 702a and the second portion 702b. As shown, the semiconductor package assemblies 200 may each be held by one or more holders 410. The conveyor belt 702 may be held under tension against one or more rollers 404. As such, the one or more rollers 404 may make frictional contact with the conveyor belt 702. In this way, when the rollers 404 are caused to rotate by a motor (not shown) they may impart a force to the conveyor belt 702 to thereby move the conveyor belt 702 along the first direction (i.e., along the x-direction). The conveyor belt 702 may be further configured to position the semiconductor package assembly at a distance from the plurality of nozzles that is in a range from approximately 0 mm to approximately 50 mm (e.g., see FIGS. 8A and 8B and related description).

FIG. 8A is a vertical cross-sectional view of a portion of the system of FIGS. 4-6 illustrating a first sprayer device 402a having a first configuration, and FIG. 8B is a vertical cross-sectional view of a portion of the system of FIGS. 4-6 illustrating a second sprayer device 402b having a second configuration, according to various embodiments. As shown, each of the first sprayer device 402a and the second sprayer device 402b include a fluidic conduit 418 extending along the second direction (i.e., y-direction) and configured to supply the pressurized cleaning fluid 302 to the plurality of nozzles 420.

The nozzles 420a in the first sprayer device 402a produce a first spatial distribution of pressurized cleaning fluid 302a at a first distance of 60 mm and a flow rate of 1.5 liters per minute (LPM), as shown in FIG. 8A. The nozzles 420b in the second sprayer device 402b are more closely spaced and produce a second spatial distribution of pressurized cleaning fluid 302b. As shown, the second spatial distribution of pressurized cleaning fluid 302b may provide a more uniform distribution of pressurized cleaning fluid 302b. The second sprayer device 402b may further provide a higher flow rate (e.g., 4.86 LPM) and a closer distance (e.g., 35 mm). In certain embodiment, the second sprayer device 402b may provide a more efficient process for cleaning the semiconductor package assemblies. The overlap of spray distribution patterns from adjacent nozzles 420b, however, may cause non-uniformities in the flow of pressurized cleaning fluid 302b, as described in greater detail, below.

FIG. 9A illustrates non-overlapping spray distribution patterns from nozzles 420 that are sufficiently separated, FIG. 9B illustrates an impact force distribution pattern 902 from a single nozzle 420, and FIG. 9C illustrates overlapping spray distribution patterns from nozzles 420 that are closely spaced, according to various embodiments. A non-uniform distribution of pressurized cleaning fluid 302 may be generated in both configurations shown in FIGS. 9A and 9C. In the configuration of FIG. 9A, for example, there may be a maximum impact force directly under each nozzle 420 (e.g., see the force distribution 902 in FIG. 9B), while there may be a minimum of impact force in a region 904 where the spray distribution patterns do not overlap. In the configuration of FIG. 9C there is partial overlap of the spray distribution patterns from adjacent nozzles 420 in a region 906 between adjacent nozzles 420. As such, the minimum value of impact force between nozzles 420 may have a greater value for the configuration of FIG. 9C than for the configuration of FIG. 9A. However, if the nozzles 420 in the configuration of FIG. 9C overlap too much there may be additional maxima of the impact force in regions 906 where the spray distribution patterns overlap. Various embodiments, described below, solve the problem of generating a uniform distribution of pressurized cleaning fluid 302 by varying the relative position of adjacent nozzles 420 in both the second direction (i.e., the y-direction) and in a direction (e.g., the x-direction or other direction) perpendicular to the second direction.

FIG. 10A illustrates a first sprayer device 402a having a first plurality of nozzles 420a, FIG. 10B illustrates a second sprayer device 402b having a second plurality of nozzles 420b, and FIG. 10C illustrates a close-up view of a portion of the second sprayer device, according to various embodiments. The first sprayer device 402a has a fluidic conduit 418 having a first plurality of nozzles 420a having a first spacing and the second sprayer device 402b has a fluidic conduit 418 having a second plurality of nozzles 420b having a closer spacing. The spacing of the first plurality of nozzles 420a may correspond to the non-overlapping spray distribution patterns described above with reference to FIGS. 8A and 9A. The spacing of the second plurality of nozzles 420b may correspond to the overlapping spray distribution patterns described above with reference to FIGS. 8B and 9C. To reduce non-uniformities do to overlap of adjacent spray distribution patterns, however, the nozzles 420b of FIG. 10B may include an additional displacement of every other nozzle in a third direction 1002 that is perpendicular to the second direction.

As shown in FIGS. 10B and 10C, the fluidic conduit 418 may form a cylindrical tube with a longitudinal axis that is oriented along the second direction (e.g., along the y-direction). A first plurality of nozzles 420b1 may be aligned with one another along a radial direction, of the cylindrical tube, the radial direction being perpendicular to the longitudinal axis. In this example, the radial direction may coincide with the z-direction in FIGS. 10A and 10B. A second plurality of nozzles 420b2 may be located between adjacent ones of the first plurality of nozzles 420b1, as shown in FIG. 10C. The second plurality of nozzles 420b2 may be displaced along a third direction 1002 perpendicular to the radial direction relative to the first plurality of nozzles 420b1. For example, each of the second plurality of nozzles 420b2 may be displaced along the first direction (i.e., the x-direction) in FIG. 10B. In some embodiments, all of the nozzles (420b1, 420b2) may be pointing downwardly (i.e., along the z-direction) and may be separated from one another along the second direction (i.e., the y-direction). Each of the second plurality of nozzles 420b2 may be displaced slightly along the direction 1002, which may coincide with the first direction (i.e., the x-direction in FIGS. 10A and 10B), as shown in FIG. 10C. A more uniform spatial distribution of pressurized cleaning fluid 302 may thus be formed by varying the relative spacing of adjacent nozzles (420b1, 420b2) in two directions.

Also as shown in FIG. 10C, plurality of nozzles (420b1, 420b2) may have an asymmetric shape 1004 such that each spray distribution pattern has a first spatial extent along the first direction (i.e., the x-direction) that is less than a second spatial extent along the second direction (i.e., the y-direction) and each spray distribution pattern may subtend an angle that is in a range from approximately 95 degrees to approximately 110 degrees (e.g., see FIGS. 8A and 8B). Further, as described above with reference to FIGS. 8A and 8B, each of the plurality of nozzles (420b1, 420b2) may be configured to generate a flow rate of pressurized cleaning fluid that is a range from approximately 4 liters/min to approximately 6 liters/minute.

Figure 11:
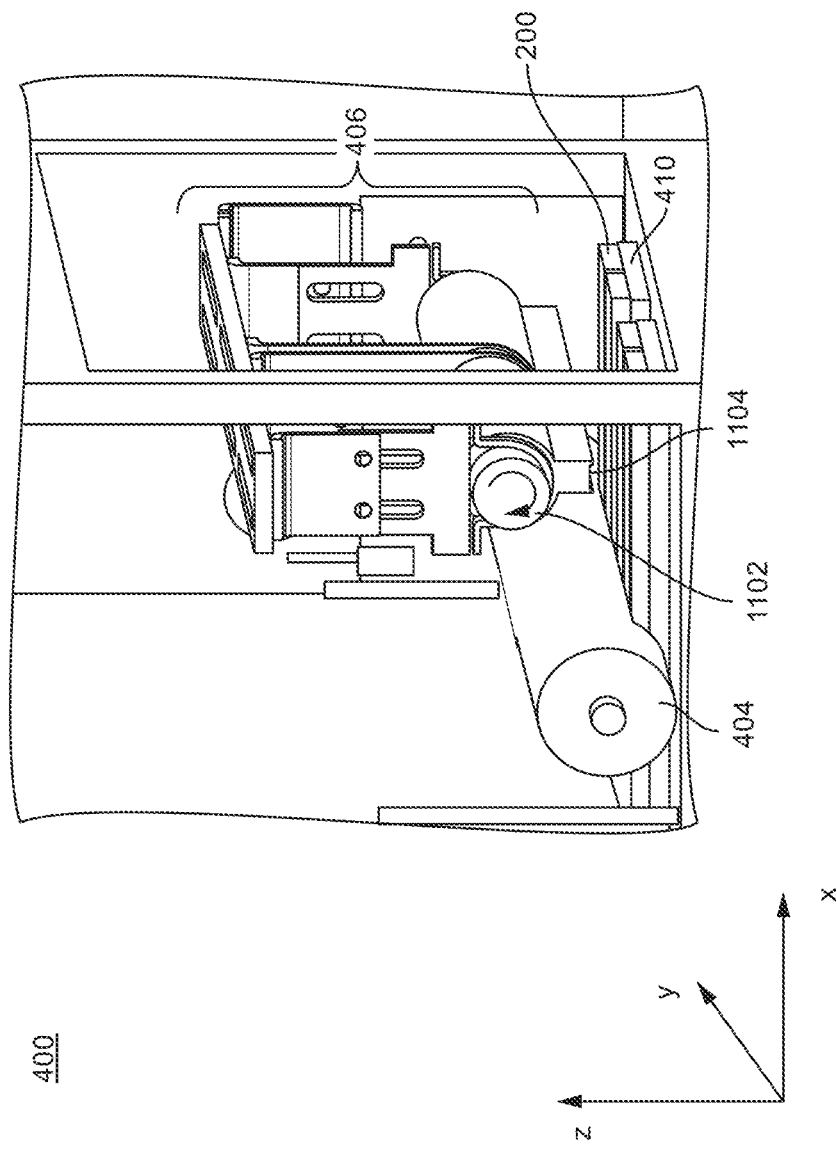
FIG. 11 is a three-dimensional perspective view of a portion of the system 400 of FIGS. 4 and 5 illustrating details of the dryer, according to various embodiments.
Figure 12:
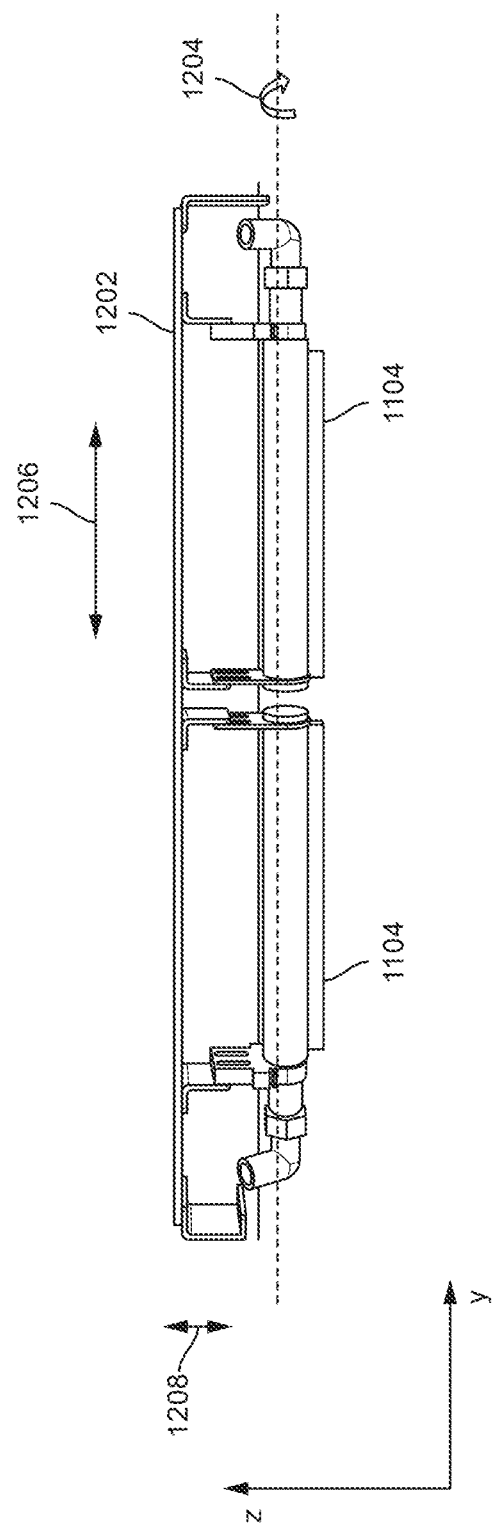
FIG. 12 is a side view of a portion of the dryer and a mounting bracket, according to various embodiments.

FIG. 11 is a three-dimensional perspective view of a portion of the system 400 of FIGS. 4 and 5 illustrating details of the dryer 406, according to various embodiments. FIG. 12 is a side view of a portion of the dryer 406 and a housing 1202, according to various embodiments. The dryer 406 may be configured as a jet air knife configured to generate the pressurized gas flow having a pressure in a range from approximately 0.02 MPa to approximately 0.08 MPa at a distance from the semiconductor package assembly 200 that is in a range from approximately 0 mm to approximately 20 mm. In this regard, the jet air knife may include an impeller 1102 the generates a pressurized gas flow that may be directed toward the semiconductor package assembly 200 through a gas nozzle 1104, as shown in FIG. 11.

As shown in FIG. 11, the gas nozzle 1104 may have an aperture having a length and a width, wherein the length is larger than the width. As shown, the aperture may be oriented such that a lengthwise extension of the aperture is aligned with a second direction (i.e., the y-direction).

According to an embodiment, the length of the aperture may be greater than or equal to approximately 150 mm. As shown in FIG. 12, the dryer 406 may further include a housing 1202 that is configured to allows a position of the gas nozzle 1104 to be adjusted by rotating the gas nozzle through an angle 1204 about an axis parallel to the second direction. The housing 1202 may further be configured to allow a lateral position 1206 of the gas nozzle 1104 to be adjusted along the second direction (i.e., the y-direction). A vertical position 1208 of the gas nozzle 1104 may be adjusted and along a third direction (i.e., the z-direction) that is perpendicular to the first direction and to the second direction.

Figure 13:
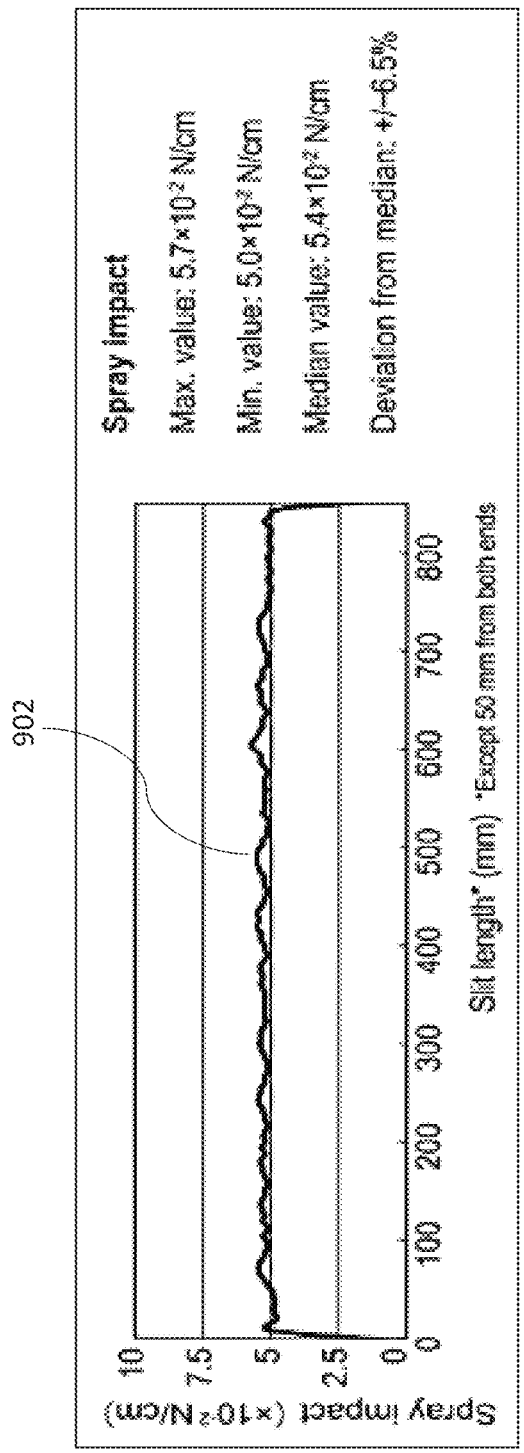
FIG. 13 is a graph showing a measured spray impact force generated by the dryer, according to various embodiments.

FIG. 13 is a graph showing a measured spray impact force 902 (e.g., see FIG. 9B) generated by the dryer 406, according various embodiments. Various embodiment dryer 406 configurations were tested with different aperture sizes. In this regard, the aperture length (i.e., slit length) was varied in a range from approximately 0 mm to approximately 800 mm. As shown, a spray impact force 902 was generated having a magnitude in a range from approximately 0.05 N/cm to approximately 0.057 N/cm. This gas flow corresponds to a pressuring in a range from 0.02 MPa to approximately 0.08 MPa at a distance from an impact surface (e.g., a surface of the semiconductor package assembly 200) that is in a range from approximately 0 mm to approximately 20 mm.

Figure 14:
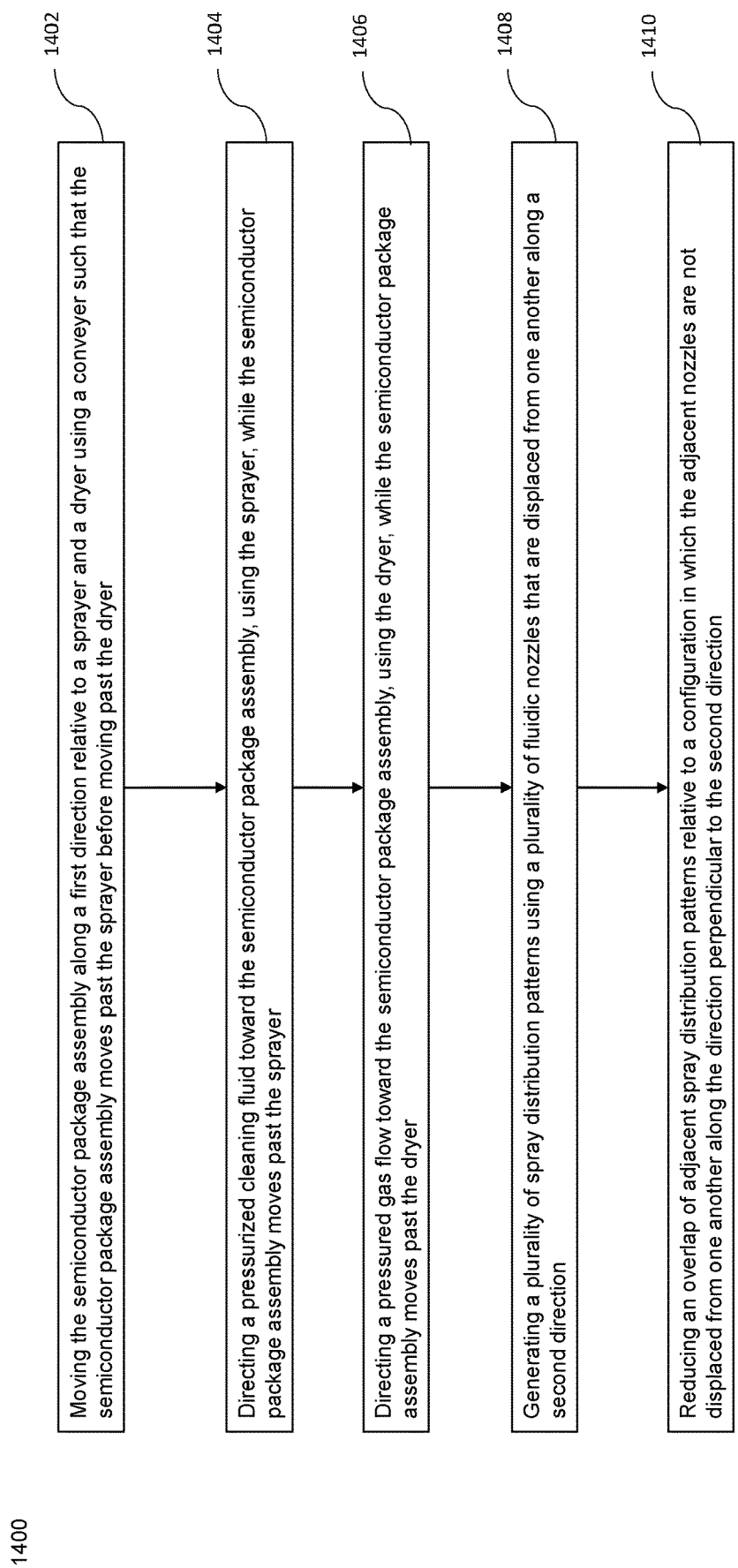
FIG. 14 is a flowchart illustrating various operations of a method of cleaning a semiconductor package assembly, according to various embodiments.

FIG. 14 is a flowchart illustrating various operations of a method 1400 of cleaning a semiconductor package assembly 200, according to various embodiments. In operation 1402, the method 1400 may include moving the semiconductor package assembly 200 along a first direction (e.g., the x-direction) relative to a sprayer device 402 and a dryer 406 using a conveyor 702. The sprayer device 402 and the dryer 406 may be spatially displaced relative to one another along the first direction such that the semiconductor package assembly 200 moves past the sprayer device 402 before moving past the dryer 406 (e.g., see FIGS. 4 and 5). In operation 1404, the method 1400 may include directing a pressurized cleaning fluid 302 toward the semiconductor package assembly 200, using the sprayer device 402, while the semiconductor package assembly 200 moves past the sprayer device 402.

In operation 1406, the method 1400 may include directing a pressurized gas 304 flow toward the semiconductor package assembly 200, using the dryer 406, while the semiconductor package assembly 200 moves past the dryer 406. In operation 1408, the method 1400 may further include generating a plurality of spray distribution patterns (e.g., see FIGS. 8A to 9C) using a plurality of fluidic nozzles (420, 420a, 420b) that are displaced from one another along a second direction (e.g., the y-direction). In operation 1410, the method 1400 may further include reducing an overlap of adjacent spray distribution patterns (e.g., see FIGS. 8B and 9C) relative to a configuration in which the adjacent nozzles are not displaced from one another along the direction perpendicular to the second direction.

In further embodiments, the method 1400 may include generating each of the plurality of spray distribution patterns using a fluidic nozzle (420, 420a, 420b) that has an asymmetric shape 1004 (e.g., see FIG. 10C) such that each spray distribution pattern has a first spatial extent along the first direction (i.e., along the x-direction) that is less than a second spatial extent along the second direction (i.e., along the y-direction), and such that the second spatial extent of each spray distribution pattern subtends an angle that is in a range from approximately 95 degrees to approximately 110 degrees (e.g., see FIGS. 8A and 8B). In further embodiments, the method 1400 may further include generating, using a jet air knife (e.g., see FIGS. 11 to 13), the pressured gas 304 flow having a pressure in a first range from approximately 0.02 MPa to approximately 0.08 MPa at a distance from the semiconductor package assembly that is in a range from approximately 0 mm to approximately 20 mm.

In further embodiments, the method 1400 may further include adjusting a position or angle 1204 (e.g., see FIG. 12) of a gas nozzle 1104 of the jet air knife by performing one or more operations including rotating the gas nozzle by an angle 1204 about an axis parallel to the second direction (e.g., the y-direction), and adjusting the lateral position 1206 of the gas nozzle along the second direction (e.g., the y-direction) or a vertical position 1208 along a third direction (e.g., the z-direction) that is perpendicular to the first direction and the second direction.

Referring to drawings and according to various embodiments of the present disclosure, a system 400 (e.g., see FIGS. 4, 5, and 11) configured to clean a semiconductor package assembly 200 is provided. The system may include a sprayer device 402 including a plurality of nozzles 420 configured to direct a pressurized cleaning fluid 302 toward the semiconductor package assembly 200; a conveyor 702 configured to move the semiconductor package assembly 200 assembly relative to the sprayer device 402 along a first direction (e.g., the x-direction); and a dryer 406 spatially displaced from the sprayer device 402 along the first direction and configured to direct a pressurized gas 304 flow at the semiconductor package assembly 200 to remove cleaning fluid introduced by the sprayer device 402.

Each of the plurality of nozzles 420 may be displaced from one another along a second direction (i.e., the y-direction) to thereby generate respective separate spray distribution patterns (e.g., see FIGS. 8A to 9C). Further, adjacent nozzles (420b1, 420b2) may be displaced from one another along a third direction (which may coincide with the first direction) perpendicular to the second direction to thereby a reduce an overlap of adjacent spray distribution patterns (e.g., see FIGS. 8A to 10C) relative to a configuration in which the adjacent nozzles are not displaced from one another along the third direction.

In an embodiment, the sprayer device 402 may further include a fluidic conduit 418 extending along the second direction and configured to supply the pressurized cleaning fluid 302 to the plurality of nozzles 420, with the plurality of nozzles 420 being attached, and fluidically coupled, to the fluidic conduit 418. The fluidic conduit 418 may be formed as a cylindrical tube with a longitudinal axis that is oriented along the second direction (e.g., see FIGS. 8A and 8B). A first plurality of nozzles 420b1 may be aligned with one another along a radial direction, of the cylindrical tube, with the radial direction being perpendicular to the longitudinal axis. A second plurality of nozzles 420b2 may be located between adjacent ones of the first plurality of nozzles 420b1, and the second plurality of nozzles 420b2 may be displaced along a direction perpendicular to the radial direction relative to the first plurality of nozzles 420b1 (e.g., see FIG. 10C). In an embodiment, the conveyor 702 may be configured to position the semiconductor package assembly 200 at a distance from the plurality of nozzles 420 that is in a range from approximately 0 mm to approximately 50 mm (e.g., see FIGS. 7A to 8B).

In one embodiment, each of the plurality of nozzles (420, 420a, 420b) may have an asymmetric shape 1004 (e.g., see FIG. 10C) such that each spray distribution pattern has a first spatial extent along the first direction that is less than a second spatial extent along the second direction. In one embodiment, a spatial extent of each spray distribution pattern may subtend an angle that is in a range from approximately 95 degrees to approximately 110 degrees (e.g., see FIGS. 8A and 8B). In one embodiment, each of the plurality of nozzles 420 may be configured to generate a flow rate of pressurized cleaning fluid that is a range from approximately 4 liters/min to approximately 6 liters/minute (e.g., see FIGS. 8A and 8B). In one embodiment, the dryer 406 may be configured as a jet air knife (e.g., see FIGS. 11 and 12) configured to generate the pressurized gas flow having a pressure in a first range from approximately 0.02 MPa to approximately 0.08 MPa (e.g., see FIG. 13) at a distance from the semiconductor package assembly that is in a second range from approximately 0 mm to approximately 20 mm.

The dryer 406 may have a gas nozzle 1104 that has an aperture having a length and a width, wherein the length is larger than the width (e.g., see FIGS. 11 and 12), and the aperture may be oriented such that a lengthwise extension of the aperture is aligned with a second direction. In various embodiments, the length of the aperture may be greater than or equal to approximately 150 mm. The dryer 406 may further include a housing 1202 that is configured to allow a position of the gas nozzle 1104 to be adjusted such that an angle 1204 of the gas nozzle may be adjusted by rotating the gas nozzle about an axis parallel to the second direction (e.g., see FIG. 12). Further, the housing is configured to allow the position 1206 of the gas nozzle 1104 to be adjusted along the second direction and the position 1208 along a third direction that is perpendicular to the first direction and to the second direction (e.g., see FIG. 12).

The conveyor may include a conveyor belt 702 and a plurality of rollers 404 that are configured to move the conveyor belt 702 along the first direction (e.g., see FIGS. 7A and 7B). The conveyor may further be configured such that the semiconductor package assembly 200 may be positioned on the conveyor belt 702 and may be moved along with the conveyor belt 702 relative to the sprayer device 402 and the dryer 406. The conveyor belt 702 may further include a mesh material (e.g., see FIG. 7A) having a first portion 702a and a second portion 702b (e.g., see FIG. 7B) such that the semiconductor package assembly 200 may be sandwiched between the first portion 702a and the second portion 702b.

Disclosed systems may provide advantages over existing systems for cleaning semiconductor package assemblies. In this regard, disclosed systems provide an improved cleaning efficiency by providing sprayer devices that achieve a more uniform distribution of pressurized cleaning fluid that may be directed to the semiconductor package assembly. The improved distribution of pressurized cleaning fluid may be achieved by using a sprayer device in which nozzles may be placed closer together along one direction and in which adjacent nozzles may be further displaced relative to one another along a another direction. Disclosed systems may further improve cleaning efficiency by providing an dryer having an jet air knife that provides a high pressure gas flow that may have increased drying efficiency and an increased efficiency of cleaning fluid removal from semiconductor package assembly, including cleaning fluid removal from spaces within the package lid.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of cleaning a semiconductor package assembly, comprising:
   moving the semiconductor package assembly along a first direction relative to a sprayer device and a dryer using a conveyor, wherein the sprayer device and the dryer are spatially displaced relative to one another along the first direction such that the semiconductor package assembly moves past the sprayer device before moving past the dryer;
   directing a pressurized cleaning fluid toward the semiconductor package assembly to thereby clean the semiconductor package assembly, using the sprayer device, while the semiconductor package assembly moves past the sprayer device; and
   directing a pressured gas flow toward the semiconductor package assembly, using the dryer, while the semiconductor package assembly moves past the dryer,
   wherein directing the pressurized cleaning fluid toward the semiconductor package assembly further comprises:
      generating a plurality of spray distribution patterns by the sprayer device that comprises a plurality of fluidic nozzles that are attached to a fluidic conduit, which comprises a longitudinal axis, such that the plurality of fluidic nozzles forms a linear array of nozzles comprising a uniform spacing between neighboring nozzles along a second direction that is parallel to the longitudinal axis of the fluidic conduit and a non-uniform spacing of the neighboring nozzles along a third direction perpendicular to the second direction, the non-uniform spacing comprising alternating displacements of the neighboring nozzles along the third direction.

2. The method of claim 1, wherein generating the plurality of spray distribution patterns further comprises:
   generating each of the plurality of spray distribution patterns using a fluidic nozzle from the plurality of fluidic nozzles, the fluidic nozzle having an asymmetric shape such that each spray distribution pattern has a first spatial extent along the first direction that is less than a second spatial extent along the second direction, and such that the second spatial extent of each spray distribution pattern subtends an angle that is in a range from approximately 95 degrees to approximately 110 degrees.

3. The method of claim 1, wherein directing the pressured gas flow toward the semiconductor package assembly further comprises:
   generating, using a jet air knife, the pressured gas flow having a pressure in a range from approximately 0.02 MPa to approximately 0.08 MPa at a distance from the semiconductor package assembly that is in a range from approximately 0 mm to approximately 20 mm.

4. The method of claim 3, wherein directing the pressured gas flow toward the semiconductor package assembly further comprises:
   adjusting a position or angle of a gas nozzle of the jet air knife by performing one or more operations comprising:

rotating the gas nozzle about an axis parallel to the second direction; and adjusting the position of the gas nozzle along the second direction or along the third direction that is perpendicular to the first direction and the second direction.

5. A method of cleaning a semiconductor package assembly, comprising:

generating a plurality of spray distribution patterns of a pressurized cleaning fluid, each spray distribution pattern having a first spatial extent along a first direction that is less than a second spatial extent along a second direction that is perpendicular to the first direction, wherein the plurality of spray distribution patterns forms a linear array of spray distribution patterns comprising a uniform spacing between neighboring spray distribution patterns along the second direction and a non-uniform spacing of the neighboring spray distribution patterns along the first direction comprising alternating displacements of the neighboring spray distribution patterns along the first direction; and directing the plurality of spray distribution patterns toward the semiconductor package assembly to thereby clean the semiconductor package assembly.

6. The method of claim 5, further comprising moving the semiconductor package assembly along the first direction relative to the plurality of spray distribution patterns.

7. The method of claim 5, wherein generating the plurality of spray distribution patterns further comprises providing the cleaning fluid to a plurality of fluidic nozzles that are displaced from one another along the second direction and adjacent nozzles are further displaced from one another along the first direction.

8. The method of claim 5, wherein generating the plurality of spray distribution patterns further comprises providing the cleaning fluid to a plurality of fluidic nozzles that each have asymmetric shape such that each spray distribution pattern has the first spatial extent along the first direction that is less than the second spatial extent along the second direction.

9. The method of claim 5, wherein generating the plurality of spray distribution patterns further comprises generating each of the plurality of spray distribution patterns to subtend angle that is in a range from approximately 95 degrees to approximately 110 degrees.

10. The method of claim 5, wherein directing the plurality of spray distribution patterns toward the semiconductor package assembly further comprises:

generating the plurality of spray distribution patterns using a plurality of nozzles that are positioned within a distance of between 0 mm and 50 mm from a surface of the semiconductor package assembly.

11. The method of claim 5, wherein directing the plurality of spray distribution patterns toward the semiconductor package assembly further comprises:

generating the plurality of spray distribution patterns to have a flow rate of pressurized cleaning fluid that is a range from approximately 4 liters/min to approximately 6 liters/minute.

12. The method of claim 5, wherein generating the plurality of spray distribution patterns further comprises:

providing the cleaning fluid to a first plurality of nozzles that are aligned with one another along a radial direction of a fluidic conduit to which the first plurality of nozzles are attached and displaced from one another along a longitudinal axis of the fluidic conduit; and providing the cleaning fluid to a second plurality of nozzles that are located between adjacent ones of the first plurality of nozzles and are displaced along a direction perpendicular to the radial direction relative to the first plurality of nozzles.

13. A method of cleaning a semiconductor package assembly, comprising:

directing a pressurized cleaning fluid toward the semiconductor package assembly to thereby clean the semiconductor package assembly using a sprayer device comprising a linear array of nozzles having a uniform spacing between neighboring nozzles along a second direction, which is parallel to a longitudinal axis of a fluidic conduit to which the linear array of nozzles is attached, and a non-uniform spacing of the neighboring nozzles along a first direction that is perpendicular to the second direction, the non-uniform spacing comprising alternating displacements of the neighboring nozzles along the first direction; and directing a pressurized gas flow toward the semiconductor package assembly using a dryer.

14. The method of claim 13, wherein directing the pressurized cleaning fluid toward the semiconductor package assembly further comprises positioning the linear array of nozzles within a distance of between 0 mm and 50 mm from a surface of the semiconductor package assembly.

15. The method of claim 13, wherein directing the pressurized cleaning fluid toward the semiconductor package assembly further comprises generating a spray distribution pattern to subtend angle that is in a range from approximately 95 degrees to approximately 110 degrees.

16. The method of claim 13, wherein directing the pressurized cleaning fluid toward the semiconductor package assembly further comprises:

generating a spray distribution pattern to have a flow rate of the pressurized cleaning fluid that is a range from approximately 4 liters/min to approximately 6 liters/minute.

17. The method of claim 13, wherein directing the pressurized gas flow toward the semiconductor package assembly further comprises generating the pressurized gas flow to have pressure between 0.02 MPa to 0.08 MPa at a distance from the semiconductor package assembly that is between 0 mm and 20 mm.

18. The method of claim 13, further comprising moving the semiconductor package assembly along the first direction relative to the sprayer device and the dryer using a conveyor.

19. The method of claim 13, wherein directing the pressurized cleaning fluid toward the semiconductor package assembly further comprises generating a spray distribution pattern that has a first spatial extent along the first direction that is less than a second spatial extent along the second direction.

20. The method of claim 13, wherein directing the pressurized gas flow toward the semiconductor package assembly further comprises:

adjusting a position or angle of a gas nozzle of the dryer by performing one or more operations comprising:

rotating the gas nozzle about an axis parallel to the second direction; or adjusting the position of the gas nozzle along the second direction or along a third direction that is perpendicular to the first direction and the second direction.

* * * * *